United States Patent
Shanbhogue et al.

(10) Patent No.: US 12,130,738 B2
(45) Date of Patent: Oct. 29, 2024

(54) COMPRESSED CACHE MEMORY WITH DECOMPRESS ON FAULT

(71) Applicant: Intel Corporation, Santa Clara, CA (US)

(72) Inventors: Vedvyas Shanbhogue, Austin, TX (US); Jayesh Gaur, Bangalore (IN); Wajdi K. Feghali, Boston, MA (US); Vinodh Gopal, Westborough, MA (US); Utkarsh Kakaiya, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 718 days.

(21) Appl. No.: 17/130,632

(22) Filed: Dec. 22, 2020

(65) Prior Publication Data

US 2022/0197793 A1   Jun. 23, 2022

(51) Int. Cl.
   *G06F 12/0802* (2016.01)
   *H03M 7/30* (2006.01)

(52) U.S. Cl.
   CPC .......... *G06F 12/0802* (2013.01); *H03M 7/60* (2013.01); *G06F 2212/401* (2013.01); *G06F 2212/60* (2013.01)

(58) Field of Classification Search
   None
   See application file for complete search history.

(56) References Cited

U.S. PATENT DOCUMENTS

| | | | |
|---|---|---|---|
| 9,405,701 B2 * | 8/2016 | Weissmann | G06F 12/1009 |
| 9,432,298 B1 * | 8/2016 | Smith | H04L 49/9057 |
| 10,191,684 B2 | 1/2019 | Gopal et al. | |
| 10,230,321 B1 * | 3/2019 | Papini | H02P 29/032 |
| 2010/0020825 A1 | 1/2010 | Bass et al. | |
| 2013/0262809 A1 | 10/2013 | Wegener | |

(Continued)

FOREIGN PATENT DOCUMENTS

WO    1997023828    7/1997

OTHER PUBLICATIONS

Extended European Search Report from European Patent Application No. 21198566.8 notified Apr. 4, 2022, 15 pgs.

(Continued)

*Primary Examiner* — Henry Tsai
*Assistant Examiner* — Christopher A Bartels
(74) *Attorney, Agent, or Firm* — Essential Patents Group, LLP

(57) ABSTRACT

An embodiment of an integrated circuit may comprise, coupled to a core, a hardware decompression accelerator, a compressed cache, a processor and communicatively coupled to the hardware decompression accelerator and the compressed cache, and memory and communicatively coupled to the processor, wherein the memory stores microcode instructions which when executed by the processor causes the processor to store a first address to a decompression work descriptor, retrieve a second address where a compressed page is stored in the compressed cache from the decompression work descriptor at the first address in response to an indication of a page fault, and send instructions to the hardware decompression accelerator to decompress the compressed page at the second address. Other embodiments are disclosed and claimed.

18 Claims, 23 Drawing Sheets

(56) References Cited

U.S. PATENT DOCUMENTS

| | | | |
|---|---|---|---|
| 2013/0318323 A1* | 11/2013 | Weissmann | G06F 12/1081 |
| | | | 711/207 |
| 2014/0267334 A1 | 9/2014 | Duluk, Jr. et al. | |
| 2015/0074339 A1* | 3/2015 | Cheriton | G06F 12/0804 |
| | | | 711/103 |
| 2019/0243780 A1* | 8/2019 | Gopal | G06F 12/0811 |
| 2021/0157906 A1* | 5/2021 | Shaon | G06F 21/54 |
| 2022/0179787 A1* | 6/2022 | Koker | G06F 12/0895 |
| 2022/0197816 A1* | 6/2022 | Powley | G06F 12/0886 |
| 2023/0237148 A1* | 7/2023 | Shaon | G06F 21/54 |
| | | | 726/1 |

OTHER PUBLICATIONS

Kwon, Sejun, et al., "Managing GPU Buffers for Caching More Apps in Mobile Systems", 2015 International Conference on Embedded Software (EMSOFT), 10 pgs.

* cited by examiner

| Byte 7 | Byte 6 | Byte 5 | Byte 4 | Byte 3 | Byte 2 | Byte 1 | Byte 0 | bytes |
|---|---|---|---|---|---|---|---|---|
| Operation | Operation Flags | | | PV | Ignored | PASID | | 0 |
| Completion Record Address | | | | | | | | 8 |
| Source 1 Address | | | | | | | | 16 |
| Destination Address | | | | | | | | 24 |
| (De)compression Flags | Completion Interrupt Handle | | | Source 1 Transfer Size | | | | 32 |
| Source 2 Address | | | | | | | | 40 |
| Source 2 Transfer Size | | | | Maximum Destination Size | | | | 48 |
| Number of Input Elements | | | | Filter Flags | | | | 56 |

FIG. 5

| | Byte 7 | Byte 6 | Byte 5 | Byte 4 | Byte 3 | Byte 2 | Byte 1 | Byte 0 | bytes |
|---|---|---|---|---|---|---|---|---|---|
| D | Operation | | Operation Flags | | PV | Reserved | PASID | | 0 |
| | Completion Record Address | | | | | | | | 8 |
| | Source 1 Address | | | | | TBD | | | 16 |
| | Destination Address | | | | | A | | | 24 |
| | (De)compression Flags | | Completion Interrupt Handle | | Source 1 Transfer Size | | TBD | len(zslice0) | 32 |
| | Source 2 Address | | | | | | | | 40 |
| | Source 2 Transfer Size | | | | Maximum Destination Size | | | 2048 | 48 |
| | Number of Input Elements | | | | Filter Flags | | | | 56 |
| | Byte 7 | Byte 6 | Byte 5 | Byte 4 | Byte 3 | Byte 2 | Byte 1 | Byte 0 | bytes |
| D+64 | Operation | | Operation Flags | | PV | Reserved | PASID | | 0 |
| | Completion Record Address | | | | | | TBD | | 8 |
| | Source 1 Address | | | | | A + len(zslice0) | | | 16 |
| | Destination Address | | | | | TBD + 2048 | | | 24 |
| | (De)compression Flags | | Completion Interrupt Handle | | Source 1 Transfer Size | | | len(zslice1) | 32 |
| | Source 2 Address | | | | | | | | 40 |
| | Source 2 Transfer Size | | | | Maximum Destination Size | | | 2048 | 48 |
| | Number of Input Elements | | | | Filter Flags | | | | 56 |

FIG. 11A

| | Byte 7 | Byte 6 | Byte 5 | Byte 4 | Byte 3 | Byte 2 | Byte 1 | Byte 0 | bytes |
|---|---|---|---|---|---|---|---|---|---|
| D | Operation | Operation Flags | | | PV | Reserved | PASID | | 0 |
| | Completion Record Address | | | | | | | | 8 |
| | Source 1 Address | | | | | | | | 16 |
| | Destination Address | | | | | | | | 24 |
| | (De)compression Flags | Completion Interrupt Handle | | | Source 1 Transfer Size | | | len(zslice0) | 32 |
| | Source 2 Address | | | | | | | | 40 |
| | Source 2 Transfer Size | | | | Maximum Destination Size | | | 2048 | 48 |
| | Number of Input Elements | | | | Filter Flags | | | | 56 |

| | Byte 7 | Byte 6 | Byte 5 | Byte 4 | Byte 3 | Byte 2 | Byte 1 | Byte 0 | bytes |
|---|---|---|---|---|---|---|---|---|---|
| D+64 | Operation | Operation Flags | | | PV | Reserved | PASID | | 0 |
| | Completion Record Address | | | | | Core cplrec1 | | | 8 |
| | Source 1 Address | | | | | A + len(zslice0) | | | 16 |
| | Destination Address | | | | | Dest Page + 2048 | | | 24 |
| | (De)compression Flags | Completion Interrupt Handle | | | Source 1 Transfer Size | | | len(zslice1) | 32 |
| | Source 2 Address | | | | | | | | 40 |
| | Source 2 Transfer Size | | | | Maximum Destination Size | | | 2048 | 48 |
| | Number of Input Elements | | | | Filter Flags | | | | 56 |

FIG. 11B

| | Byte 7 | Byte 6 | Byte 5 | Byte 4 | Byte 3 | Byte 2 | Byte 1 | Byte 0 | bytes |
|---|---|---|---|---|---|---|---|---|---|
| SP | Operation | Operation Flags | | | PV | Reserved | PASID | | 0 |
| | Completion Record Address | | | | | | | | 8 |
| | Source 1 Address | | | | | | | | 16 |
| | Destination Address | | | | | | | | 24 |
| | (De)compression Flags | | Completion Interrupt Handle | | | Source 1 Transfer Size | | len(zslice0) | 32 |
| | Source 2 Transfer Size | | | | Source 2 Address | | | | 40 |
| | Number of Input Elements | | | | Maximum Destination Size | | 2048 | | 48 |
| | | | | | | | Filter Flags | | 56 |

| | Byte 7 | Byte 6 | Byte 5 | Byte 4 | Byte 3 | Byte 2 | Byte 1 | Byte 0 | bytes |
|---|---|---|---|---|---|---|---|---|---|
| SP +64 | Operation | Operation Flags | | | PV | Reserved | PASID | | 0 |
| | Completion Record Address | | | | | | | | 8 |
| | Source 1 Address | | | | | | | | 16 |
| | Destination Address | | | | | | A + len(zslice0) | | 24 |
| | (De)compression Flags | | Completion Interrupt Handle | | | Source 1 Transfer Size | | len(zslice1) | 32 |
| | Source 2 Transfer Size | | | | Source 2 Address | | | | 40 |
| | Number of Input Elements | | | | Maximum Destination Size | | 2048 | | 48 |
| | | | | | | | Filter Flags | | 56 |

FIG. 12B

FIG. 12A

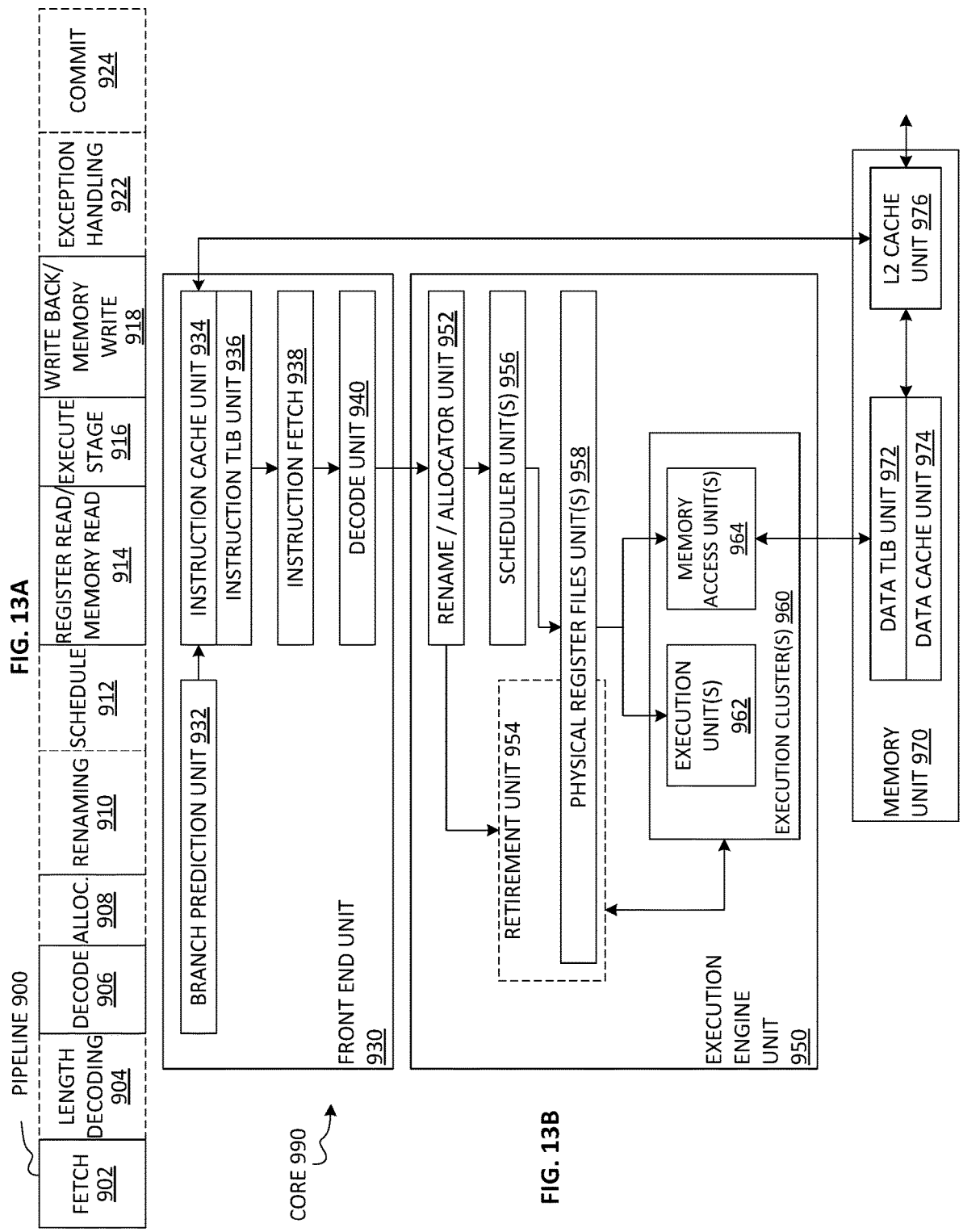

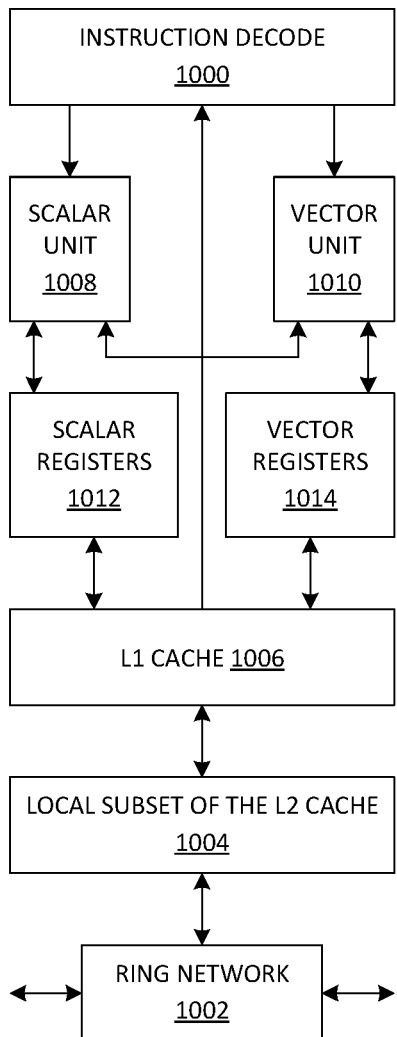
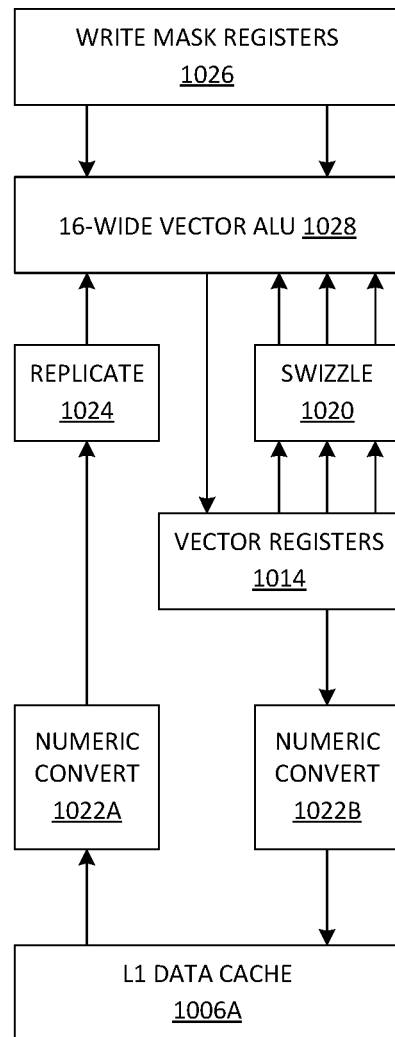
FIG. 14A
FIG. 14B

COMPRESSED CACHE MEMORY WITH DECOMPRESS ON FAULT

BACKGROUND

1. Technical Field

This disclosure generally relates to processor technology, cache technology, and compression technology.

2. Background Art

ZCACHE is a driver that captures and compresses evicted clean page cache pages. When clean pages are reclaimed, ZCACHE compresses/stores contents of evicted pages in random access memory (RAM). When a file system reads file pages, ZCACHE checks if it has a copy and, if so, decompresses/returns the data. Otherwise, the data is read from the file system/disk as normal. ZCACHE captures and compresses swap pages in RAM. When a page needs to be swapped out, ZCACHE compresses/stores contents of the swap page in RAM. When a page needs to be swapped in, if the front swap bit is set, ZCACHE decompresses/returns the data. Otherwise, the data is read from the swap disk as normal.

ZSWAP is a LINUX kernel feature that provides a compressed write-back cache for swapped pages, as a form of virtual memory compression. Instead of moving memory pages to a swap device when they are to be swapped out, ZSWAP performs their compression and then stores them into a memory pool dynamically allocated in the system RAM. Later, writeback to the actual swap device is deferred or even completely avoided, resulting in a significantly reduced input/output (I/O) for LINUX systems that require swapping. The tradeoff is the need for additional central processor unit (CPU) cycles to perform the compression.

ZRAM is a LINUX kernel module for creating a compressed block device in RAM, in other words a RAM disk, but with on-the-fly disk compression. The block device created with ZRAM can then be used for swap or as general-purpose RAM disk. The two most common uses for ZRAM are for the storage of temporary files (/tmp) and as a swap device.

BRIEF DESCRIPTION OF THE DRAWINGS

The various embodiments of the present invention are illustrated by way of example, and not by way of limitation, in the figures of the accompanying drawings and in which:

FIG. 5 is an illustrative diagram of an example of a work descriptor according to an embodiment;

FIG. 11A to 11B are illustrative diagrams of an example of a pair of work descriptors according to an embodiment;

FIG. 12A to 12B are illustrative diagrams of an example of a data structure and a pair of work descriptors according to an embodiment;

FIG. 13A is a block diagram illustrating both an exemplary in-order pipeline and an exemplary register renaming, out-of-order issue/execution pipeline according to embodiments of the invention.

FIG. 13B is a block diagram illustrating both an exemplary embodiment of an in-order architecture core and an exemplary register renaming, out-of-order issue/execution architecture core to be included in a processor according to embodiments of the invention;

FIGS. 14A-B illustrate a block diagram of a more specific exemplary in-order core architecture, which core would be one of several logic blocks (including other cores of the same type and/or different types) in a chip;

DETAILED DESCRIPTION

Figure 1A:
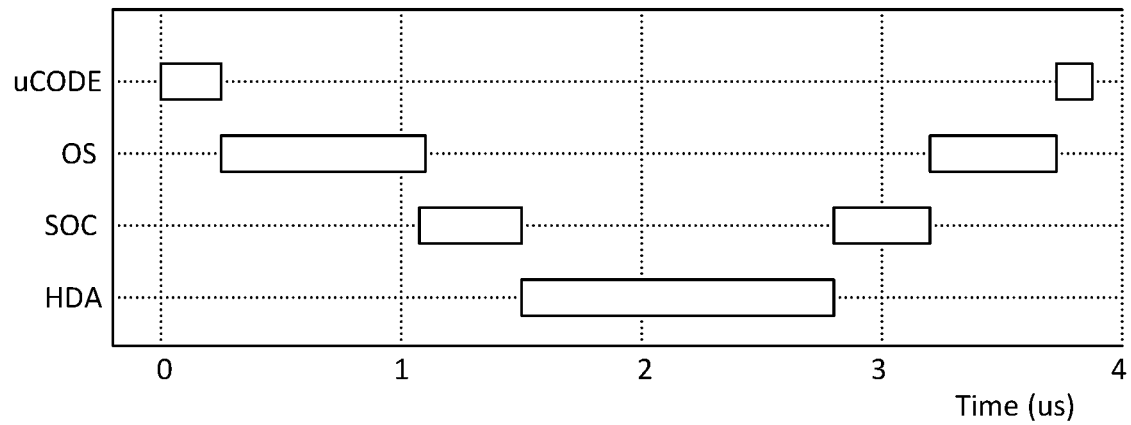
FIGS. 1A to 1B are illustrative diagrams of an example comparison of timing of a page fault in accordance with some embodiments.

Embodiments discussed herein variously provide techniques and mechanisms for utilizing a compressed cache. The technologies described herein may be implemented in one or more electronic devices. Non-limiting examples of electronic devices that may utilize the technologies described herein include any kind of mobile device and/or stationary device, such as cameras, cell phones, computer terminals, desktop computers, electronic readers, facsimile machines, kiosks, laptop computers, netbook computers, notebook computers, internet devices, payment terminals, personal digital assistants, media players and/or recorders, servers (e.g., blade server, rack mount server, combinations thereof, etc.), set-top boxes, smart phones, tablet personal computers, ultra-mobile personal computers, wired telephones, combinations thereof, and the like. More generally, the technologies described herein may be employed in any of a variety of electronic devices including integrated circuitry which is operable to control or utilize a cache.

In the following description, numerous details are discussed to provide a more thorough explanation of the embodiments of the present disclosure. It will be apparent to one skilled in the art, however, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate a greater number of constituent signal paths, and/or have arrows at one or more ends, to indicate a direction of information flow. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct connection, such as electrical, mechanical, or magnetic connection between the things that are connected, without any intermediary devices. The term "coupled" means a direct or indirect connection, such as a direct electrical, mechanical, or magnetic connection between the things that are connected or an indirect connection, through one or more passive or active intermediary devices. The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The term "device" may generally refer to an apparatus according to the context of the usage of that term. For example, a device may refer to a stack of layers or structures, a single structure or layer, a connection of various structures having active and/or passive elements, etc. Generally, a device is a three-dimensional structure with a plane along the x-y direction and a height along the z direction of an x-y-z Cartesian coordinate system. The plane of the device may also be the plane of an apparatus which comprises the device.

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e. scaling down, or scaling up respectively) of a signal frequency relative to another parameter, for example, power supply level.

The terms "substantially," "close," "approximately," "near," and "about," generally refer to being within +/−10% of a target value. For example, unless otherwise specified in the explicit context of their use, the terms "substantially equal," "about equal" and "approximately equal" mean that there is no more than incidental variation between among things so described. In the art, such variation is typically no more than +/−10% of a predetermined target value.

It is to be understood that the terms so used are interchangeable under appropriate circumstances such that the embodiments of the invention described herein are, for example, capable of operation in other orientations than those illustrated or otherwise described herein.

Unless otherwise specified the use of the ordinal adjectives "first," "second," and "third," etc., to describe a common object, merely indicate that different instances of like objects are being referred to and are not intended to imply that the objects so described must be in a given sequence, either temporally, spatially, in ranking or in any other manner.

The terms "left," "right," "front," "back," "top," "bottom," "over," "under," and the like in the description and in the claims, if any, are used for descriptive purposes and not necessarily for describing permanent relative positions. For example, the terms "over," "under," "front side," "back side," "top," "bottom," "over," "under," and "on" as used herein refer to a relative position of one component, structure, or material with respect to other referenced components, structures or materials within a device, where such physical relationships are noteworthy. These terms are employed herein for descriptive purposes only and predominantly within the context of a device z-axis and therefore may be relative to an orientation of a device. Hence, a first material "over" a second material in the context of a figure provided herein may also be "under" the second material if the device is oriented upside-down relative to the context of the figure provided. In the context of materials, one material disposed over or under another may be directly in contact or may have one or more intervening materials. Moreover, one material disposed between two materials may be directly in contact with the two layers or may have one or more intervening layers. In contrast, a first material "on" a second material is in direct contact with that second material. Similar distinctions are to be made in the context of component assemblies.

The term "between" may be employed in the context of the z-axis, x-axis or y-axis of a device. A material that is between two other materials may be in contact with one or both of those materials, or it may be separated from both of the other two materials by one or more intervening materials. A material "between" two other materials may therefore be in contact with either of the other two materials, or it may be coupled to the other two materials through an intervening material. A device that is between two other devices may be directly connected to one or both of those devices, or it may be separated from both of the other two devices by one or more intervening devices.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C. It is pointed out that those elements of a figure having the same reference numbers (or names) as the elements of any other figure can operate or function in any manner similar to that described, but are not limited to such.

In addition, the various elements of combinatorial logic and sequential logic discussed in the present disclosure may pertain both to physical structures (such as AND gates, OR gates, or XOR gates), or to synthesized or otherwise optimized collections of devices implementing the logical structures that are Boolean equivalents of the logic under discussion.

Some embodiments provide technology to decompress on fault, and/or parallel decompress on fault. Some computing systems may utilize a lightweight compressed cache (LCC) for swap pages (e.g., such as ZSWAP). The LCC may take pages that are in the process of being swapped out and attempt to compress them into a dynamically allocated RAM-based memory pool, which basically trades CPU cycles for potentially reduced swap I/O. This trade-off may result in a significant performance improvement if reads from the compressed cache are faster than reads from a swap device.

Some compressed cache-based page swapping technology may utilize software implementations of the compression algorithms. The latency involved with performing software based compression may limit such software from being too aggressive to perform page swapping to the LCC because the decompress latency on a subsequent access to that page and the associated performance impact to the workload would not be acceptable. Some CPUs/processors may include hardware compression/decompression circuitry to support more aggressive swapping to a compressed cache. For example, some processors may include a hardware decompression accelerator (HDA).

With reference to FIG. 1A, an example timing diagrams shows how much time is spent is spent in various processing steps for a page fault. The x-axis illustrates a number of microseconds to perform each processing step. As illustrated, a page fault when the workload accesses a swapped page starts at time 0 with microcode (ucode) starting to deliver the page fault exception to software. The operating system (OS) page fault handler then executes next and after the OS page fault handler finds that the page has been swapped to a compressed cache the OS page fault handler issues an enqueue (ENQ) transaction with a decompress work descriptor for a HDA (e.g., around 1.1 microseconds). The ENQ transaction may correspond to a set of instructions that take a descriptor from a memory location and write it to a queue in an accelerator device (e.g., such as a HDA, a hardware decompress engine, etc.). In this example, the latency to deliver the ENQ transaction from core through a system-on-a-chip (SOC) fabric to the HDA is the next bar (labeled SOC). The HDA performs the decompression and signals the completion. The completion signal has to transit the SOC fabric and reach the core, at which point the OS software that was waiting for the completion executes the rest of the processing and invokes an interrupt return (IRET) instruction to return to the workload that generated the page fault. The last bar in the diagram is the latency of the IRET instruction. In this example, all of the processing of the page fault takes about 3.8 microseconds.

Some embodiments may provide technology to further reduce the latency of the page fault processing by allowing some of the serialized operations to be overlapped. Advantageously, with the reduced latency, software may be more aggressive in swapping pages to the compressed cache. More pages being compressed provides further advantages in that software has more memory available to host additional workloads (e.g., which for a server operator, cloud service provider, etc. leads to cost savings because they can now support more densely packed workloads without causing additional performance penalty to the workloads). The total cost of ownership of the computing system (e.g., server) may be reduced significantly because memory may be one of the more expensive components in the system.

Decompress on Fault Examples

Figure 1B:
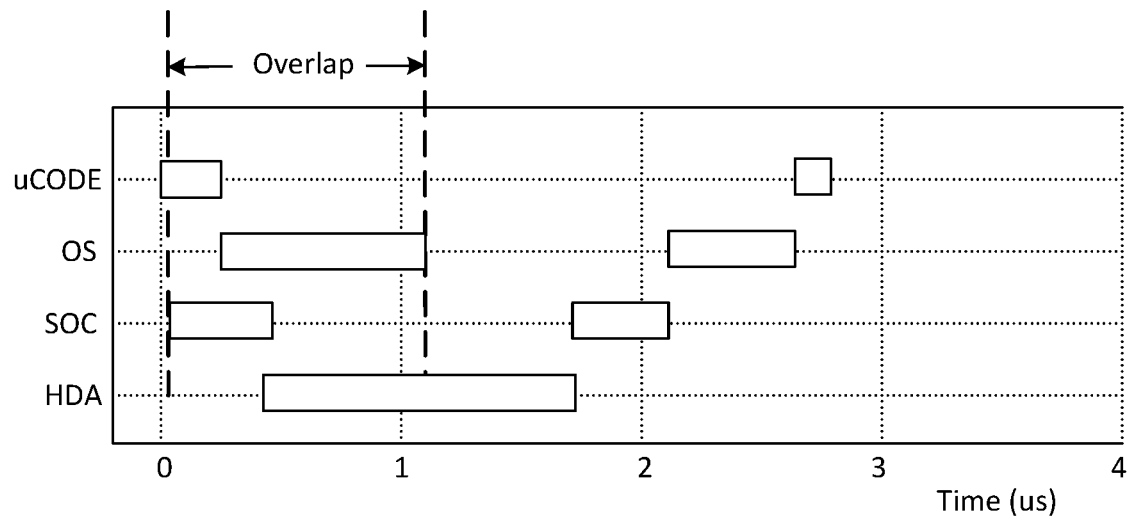

With reference to FIG. 1B, some embodiments may provide technology for software to provide an address where a compressed page is stored in memory to the microcode that delivers the page fault exception. The microcode can then generate the ENQ transaction to the HDA. As shown in FIG. 1B, some embodiments overlap the microcode delivery of the page fault exception and most of the OS page fault handling with the decompression occurring in the HDA. Advantageously, some embodiments provide reduction in latency of page fault processing by overlapping the decompression with other operations to allow software to be more aggressive in swapping memory to the compressed cache without incurring additional performance overheads to the workloads. In the illustrated example, the overlapping allows the page fault handling latency to be reduced by about 28%, allowing for more aggressive swapping of pages to the compressed cache.

Figure 2:
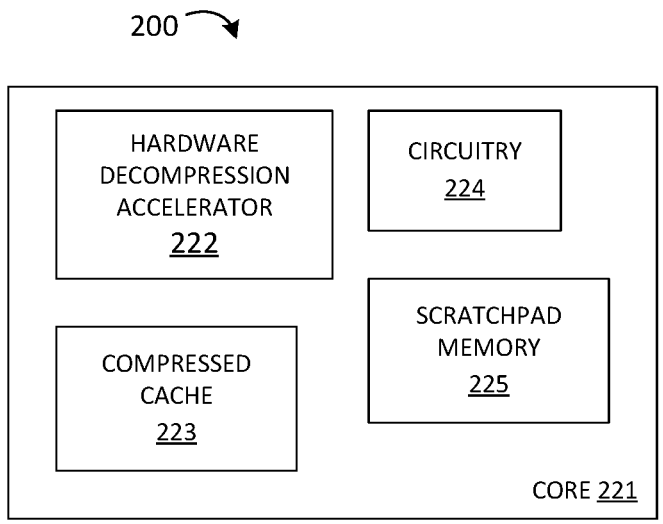
FIG. 2 is a block diagram of an example of an integrated circuit according to an embodiment.

With reference to FIG. 2, an embodiment of an integrated circuit 200 may include a core 221, a hardware decompression accelerator 222 coupled to the core 221, a compressed cache 223 coupled to the core 221, and circuitry 224 coupled to the core 221 and communicatively coupled to the hardware decompression accelerator 222 and the compressed cache 223. The circuitry 224 may be configured to store a first address to a decompression work descriptor (e.g., the first address points to the decompression work descriptor), retrieve a second address where a compressed page is stored in the compressed cache from the decompression work descriptor at the first address in response to an indication of a page fault, and send instructions to the hardware decompression accelerator to decompress the compressed page at the second address. In some embodiments, the integrated circuit 200 further includes a scratchpad memory 225 coupled to the core 221 and communicatively coupled to the circuitry 224. For example, the circuitry 224 may be configured to store the first address of the decompression work descriptor in the scratchpad memory 225, and the decompression work descriptor may include the second address that corresponds to a next page to decompress. For example, the scratchpad memory 225 may include a model specific register (MSR) that includes a field that indicates a logical processor associated with the MSR.

In some embodiments, the circuitry 224 may be further configured to load a page table entry that corresponds to a virtual address of a page that faulted, determine if the page table entry indicates that the page is to be decompressed on fault, and, if so determined, generate an enqueue transaction to the hardware decompression accelerator 222 with a compressed page address from the page table entry as a source and the second address retrieved from the decompression work descriptor as a target. The circuitry 224 may also be configured to skip the generation of the enqueue transaction if the page table entry indicates that another decompress operation is queued, skip the generation of the enqueue transaction if the decompress work descriptor with the address of the compressed page is determined to be invalid, and/or to atomically set a field in the page table entry to indicate that a logical processor associated with the page fault has queued a decompress operation. Those skilled in the art will appreciate that the circuitry 224 may include appropriately configured logic circuits, state machines, etc. Additionally, or alternatively, some or all of the circuitry 224 may be implemented with appropriate microcode instructions which, when executed by a processor, cause the processor to perform the various functions of the circuitry 224.

Figure 19:
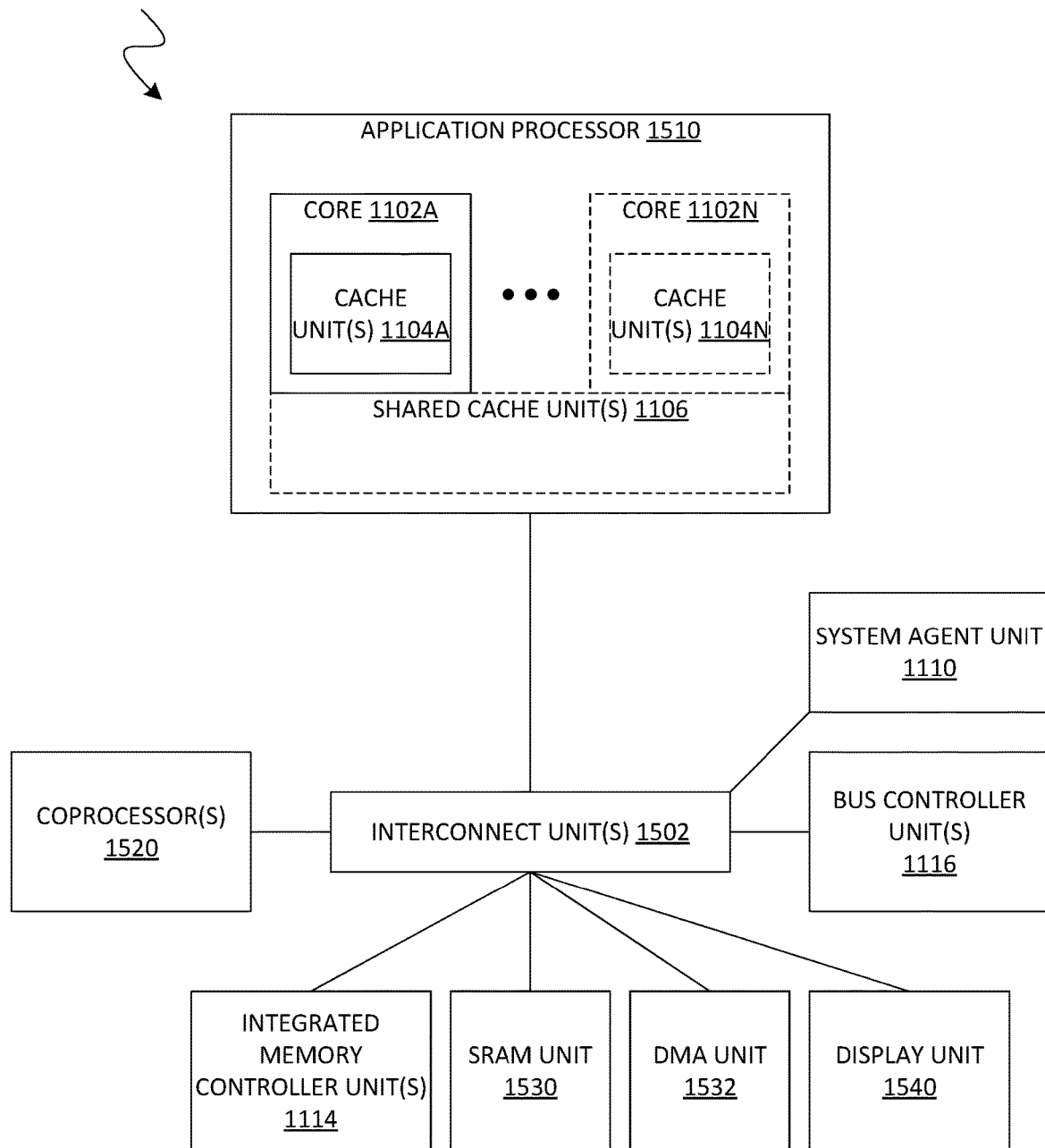
Figure 20:
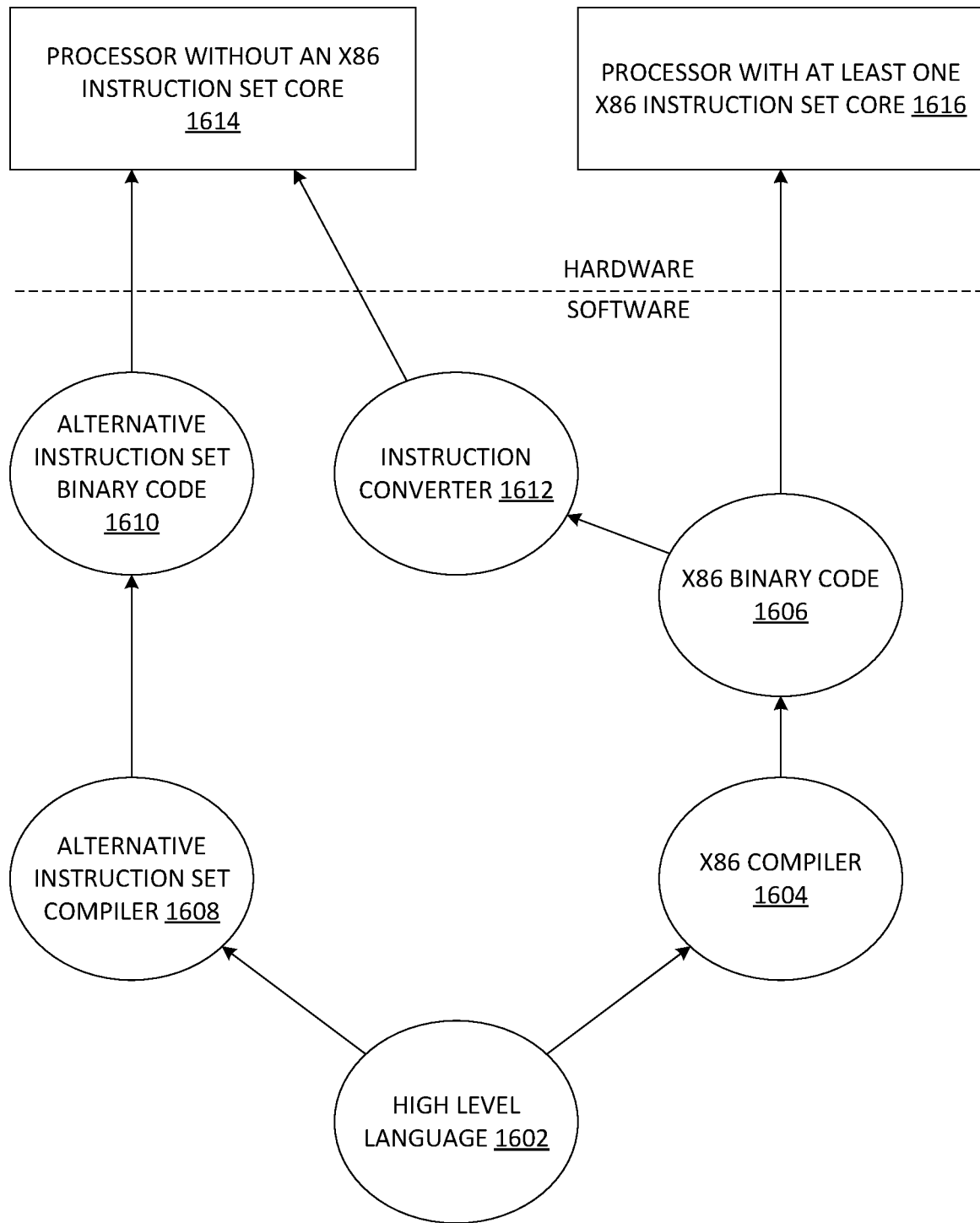
FIG. 20 is a block diagram contrasting the use of a software instruction converter to convert binary instructions in a source instruction set to binary instructions in a target instruction set according to embodiments of the invention.

Embodiments of the hardware decompression accelerator 222, the compressed cache 223, the circuitry 224, and/or the scratchpad memory 225 may be incorporated in a processor including, for example, the core 990 (FIG. 13B), the cores 1102A-N (FIGS. 15, 19), the processor 1210 (FIG. 16), the co-processor 1245 (FIG. 16), the processor 1370 (FIGS. 17-18), the processor/coprocessor 1380 (FIGS. 17-18), the coprocessor 1338 (FIGS. 17-18), the coprocessor 1520 (FIG. 19), and/or the processors 1614, 1616 (FIG. 20).

Figure 3A:
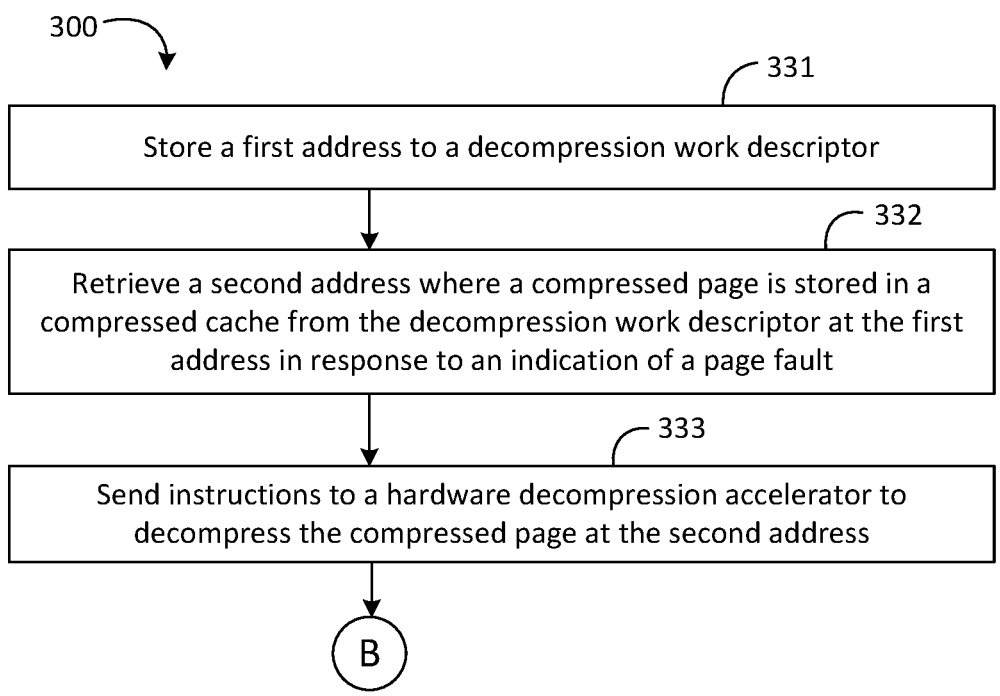
FIGS. 3A to 3B are flow diagrams of an example of a method according to an embodiment.
Figure 3B:
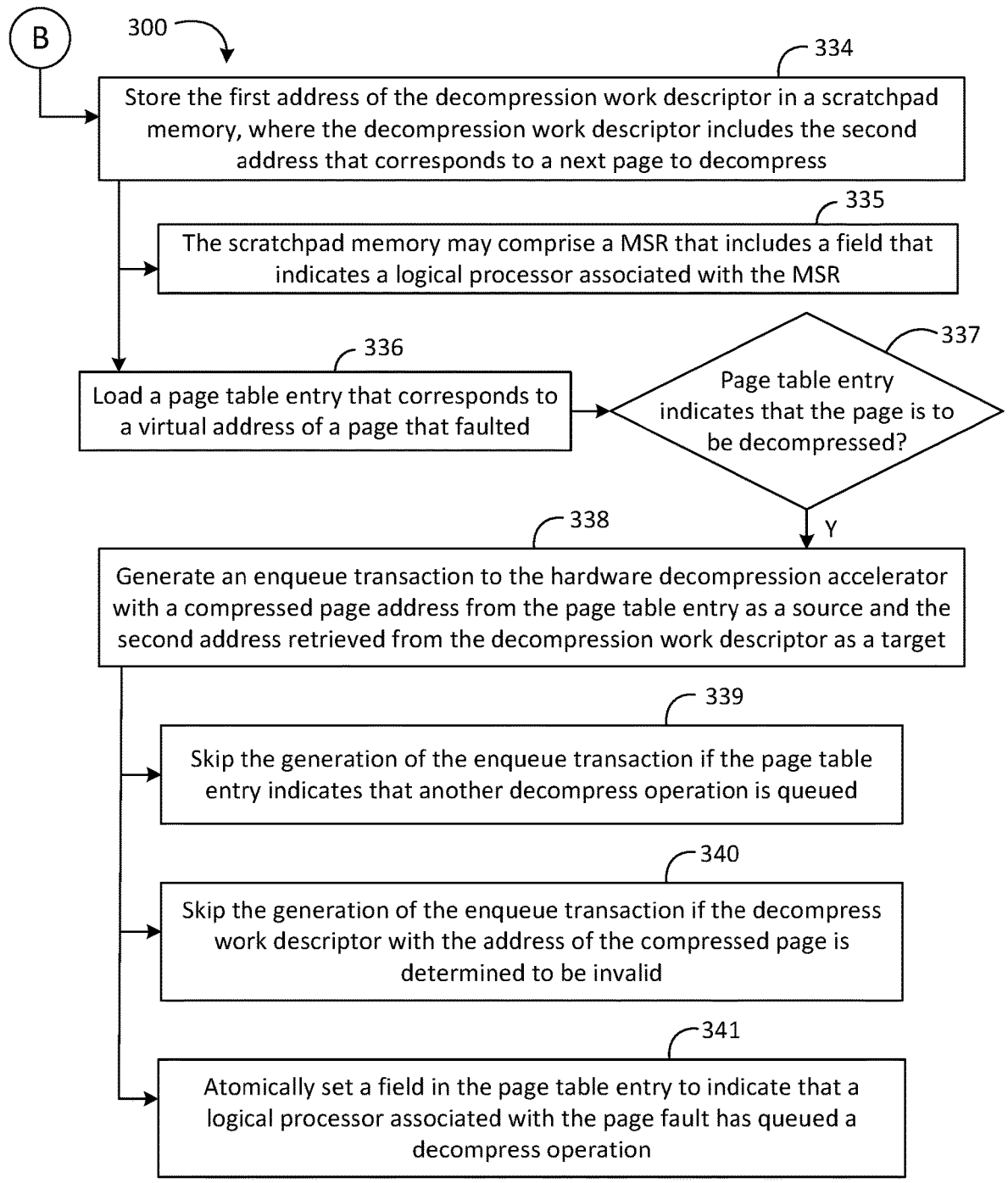

With reference to FIGS. 3A to 3B, an embodiment of a method 300 may include storing a first address to a decompression work descriptor at box 331, retrieving a second address where a compressed page is stored in a compressed cache from the decompression work descriptor at the first address in response to an indication of a page fault at box 332, and sending instructions to a hardware decompression accelerator to decompress the compressed page at the second address at box 333. For example, the method 300 may include storing the first address of the decompression work descriptor in a scratchpad memory at box 334, where the decompression work descriptor includes the second address that corresponds to a next page to decompress. In some embodiments, the scratchpad memory may comprise a MSR that includes a field that indicates a logical processor associated with the MSR at box 335.

Some embodiments of the method 300 may further include loading a page table entry that corresponds to a virtual address of a page that faulted at box 336, determining if the page table entry indicates that the page is to be decompressed on fault at box 337, and, if so determined, generating an enqueue transaction to the hardware decompression accelerator with a compressed page address from the page table entry as a source and the second address retrieved from the decompression work descriptor as a target at box 338. The method 300 may also include skipping the generation of the enqueue transaction if the page table entry indicates that another decompress operation is queued at box 339, skipping the generation of the enqueue transaction if the decompress work descriptor with the address of the compressed page is determined to be invalid at box 340, and/or atomically setting a field in the page table entry to indicate that a logical processor associated with the page fault has queued a decompress operation at box 341.

Figure 4:
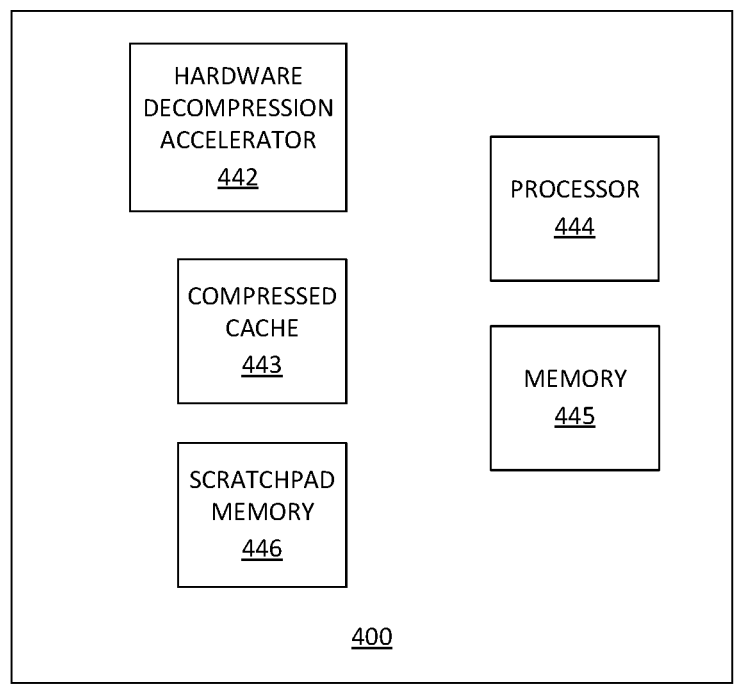
FIG. 4 is a block diagram of an example of an apparatus according to an embodiment.

With reference to FIG. 4, an embodiment of an apparatus 400 may include a hardware decompression accelerator 442, a compressed cache 443, a processor 444 communicatively coupled to the hardware decompression accelerator 442 and the compressed cache 443, and memory 445 communicatively coupled to the processor 444. The memory 445 may store microcode instructions which when executed by the processor 444 causes the processor 444 to store a first address to a decompression work descriptor, retrieve a second address where a compressed page is stored in the compressed cache 443 from the decompression work descriptor at the first address in response to an indication of a page fault, and send instructions to the hardware decompression accelerator 442 to decompress the compressed page at the second address. Some embodiments of the apparatus 400 may further include scratchpad memory 446 communicatively coupled to the processor 444 to store the first address of the decompression work descriptor, where the decompression work descriptor includes the second address that corresponds to a next page to decompress. For example, the scratchpad memory 446 may include a MSR that includes a field that indicates a logical processor associated with the MSR.

In some embodiments, the memory 445 may store further instructions which when executed by the processor 444 causes the processor 444 to load a page table entry that corresponds to a virtual address of a page that faulted, determine if the page table entry indicates that the page is to be decompressed on fault, and, if so determined, generate an enqueue transaction to the hardware decompression accelerator 442 with a compressed page address from the page table entry as a source and the second address retrieved from the decompression work descriptor as a target. The memory 445 may also store further instructions which when executed by the processor 444 causes the processor 444 to skip the generation of the enqueue transaction if the page table entry indicates that another decompress operation is queued, skip the generation of the enqueue transaction if the decompress work descriptor with the address of the compressed page is determined to be invalid, and/or to atomically set a field in the page table entry to indicate that a logical processor associated with the page fault has queued a decompress operation.

Embodiments of the hardware decompression accelerator 442, the compressed cache 443, the memory 445, and/or the scratchpad memory 446 may be integrated with a processor including, for example, the core 990 (FIG. 13B), the cores 1102A-N (FIGS. 15, 19), the processor 1210 (FIG. 16), the co-processor 1245 (FIG. 16), the processor 1370 (FIGS. 17-18), the processor/coprocessor 1380 (FIGS. 17-18), the coprocessor 1338 (FIGS. 17-18), the coprocessor 1520 (FIG. 19), and/or the processors 1614, 1616 (FIG. 20).

Some embodiments utilize a MSR which holds a 64 B aligned linear address of a decompression work descriptor that would be queued for the next page that needs decompression. In some embodiments, the MSR may nominally be referred as "IA32_DECOMP_DESCRIPTOR_PTR." In some embodiments, the MSR is a thread scoped MSR. The decompression work descriptor may have following format:

QWORD 0 Bit 51:0 - Address of next target page to decompress to. This may be a physical address or a virtual address - depending on how the PASID is configured in the IOMMU
Bit 63 - VALID
QWORD 1 Process Address Space Identifier (PASID)
QWORD 2 Completion record address - this may be a physical address or a
virtual address depending on how the PASID is configured in the I/O memory management unit (IOMMU)
QWORD 3 Operation and Decompression flags
QWORD 4 Maximum source buffer size Software programs the decompression descriptor with the physical address of a page of memory into which decompression should be done on the next page fault that occurs in user level application (e.g., ring 3). When software swaps a page to compressed cache, the software updates the page table entry (PTE) corresponding to the swapped page as follows:
 1. Marks the page as not-present by clearing the present bit.
 2. Compresses the page using the HDA and stores the page in the compressed swap cache.
 3. Stores the address of the location in the compressed swap cache where the compressed page is stored in the PTE which was marked not-present. The address may be a virtual address or a physical address. If a virtual address is configured, then software is expected to configure the PASID in the IOMMU to translate from virtual to physical. If configuring a guest physical address, then the software is expected to configure the PASID to translate from guest physical to physical. Likewise, if direct memory access (DMA) translations are not enabled for the PASID then this address could be a physical address.
 4. Sets a bit, referred to herein as the "decompress-on-fault" bit, in the PTE (e.g., the decompress-on-fault bit will be interpreted by hardware) to indicate that hardware should trigger a decompress of this compressed page if an access to this page occurs.
 5. The OS then executes an IRET to return to ring 3 to continue executing the workload.

When an IRET occurs to transition from an OS kernel level (ring 0) to a user application level (ring 3), microcode caches the two quadwords of the descriptor into internal scratchpad registers (e.g., the IA32_DECOMP_DESCRIPTOR_PTR may hold the address of the internal scratchpad registers).

When hardware signals a page fault to microcode, microcode proceeds to load the page table entry corresponding to the virtual address that faulted and if the "decompress-on-fault-bit" is 0 or the "decompress queued" bit is 1 (described below) then microcode skips rest of the steps and continues to deliver the page fault normally. If the decompress descriptor with the address of the page to decompress to was not valid at time of last IRET then microcode skips rest of the steps and continues to deliver the page fault normally.

If the "decompress-on-fault-bit" is 1, and the "decompress queued" bit is 0, and the decompress descriptor with the address of the page to decompress to is valid, the microcode then atomically sets the "decompress queued" bit in the PTE using a locked read-modify-write operation. The atomic operation enforces that if a page fault to this address occurs simultaneously from two logical processors then only one submits the decompress (i.e., the thread that wins the race and is able to set the "decompress queued" flag). Microcode then generates an ENQ transaction with the source as the compressed page address as read from the PTE, and the target as the page address read from the decompression descriptor on the last IRET.

FIG. 5 shows an illustrative example of a work descriptor contents, which may be queued to HDA by microcode using an ENQ transaction. Microcode uses the contents of the decompression work descriptor pointed to by the IA32_DECOMP_DESCRIPTOR_PTR to fill the destination address, PASID, operation flags, and decompression flags. Microcode fills the source transfer size as the maximum source buffer size as specified by software—if the actual source buffer compressed to smaller than that size then the IAX will stop processing earlier. The maximum destination size is filled as four (4) kilobytes (KB).

The microcode then continues to do the rest of the page fault delivery flow including, for example, finding the software page fault handlers address in the IDT, pushing the faulting instruction pointer and stack pointer on the stack, and pushing an error code on the start. The microcode also pushes a bit in the error code on stack to indicate if this logical processor had submitted the ENQ to the HDA. The microcode then continues to fetch the software page fault handlers' instructions.

After the OS page fault handler is done with its pre-processing, the OS page fault handler reads the fault PTE. If the "decompress queued" bit is set, the OS page fault handler then checks if the microcode on this logical processor was the one that queued the decompression by checking the bit in the error code on its stack. If the decompression was not queued by this logical processor then there was a race and there is another logical processor also handling a page fault to same address. In this case the software waits for the page fault handler on the logical processor where the ENQ was queued to complete the page fault. Note that a similar race can occur where the software page fault handler performs the ENQ and, to avoid queueing an ENQ from multiple logical processors to initiate the decompress, software can atomically set the "decompress queued" when the software performs the decompression queuing.

If the decompression was queued by this logical processor then the OS page fault handler reads the status of the ENQ transaction that was queued using another per-logical-processor MSR, referred to herein as "IA32_DECOMP_ENQ_STATUS," to determine if the ENQ submitted by microcode was accepted into the HDA work queue. If the HDA work queue was busy, the ENQ may have been rejected by the HDA. If the status indicates that the ENQ was accepted, then the software waits on the HDA to write the completion record with the decompression status. If the ENQ issued by microcode was not accepted by the HDA then at this point the software generates an ENQ again to submit the decompression work to the HDA.

After the decompression is completed, the OS allocates a new page to use as target page for decompression on next page fault and stores the address of the new page in the decompression work descriptor. The OS then invokes an IRET to continue executing the workload that faulted.

Parallel Decompress on Fault Examples

Figure 6A:
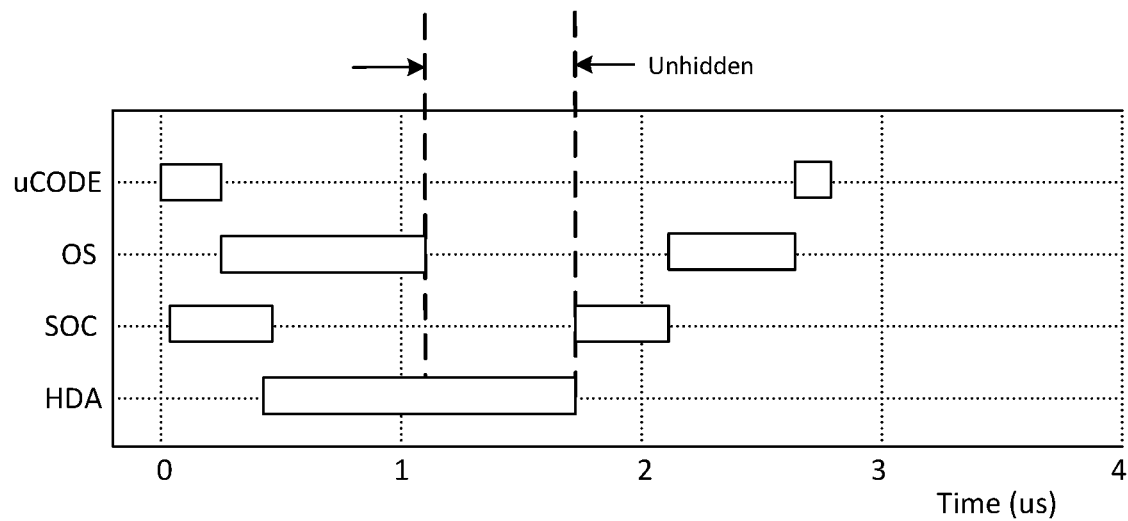
FIGS. 6A to 6B are illustrative diagrams of another example comparison of timing of a page fault in accordance with some embodiments.
Figure 6B:
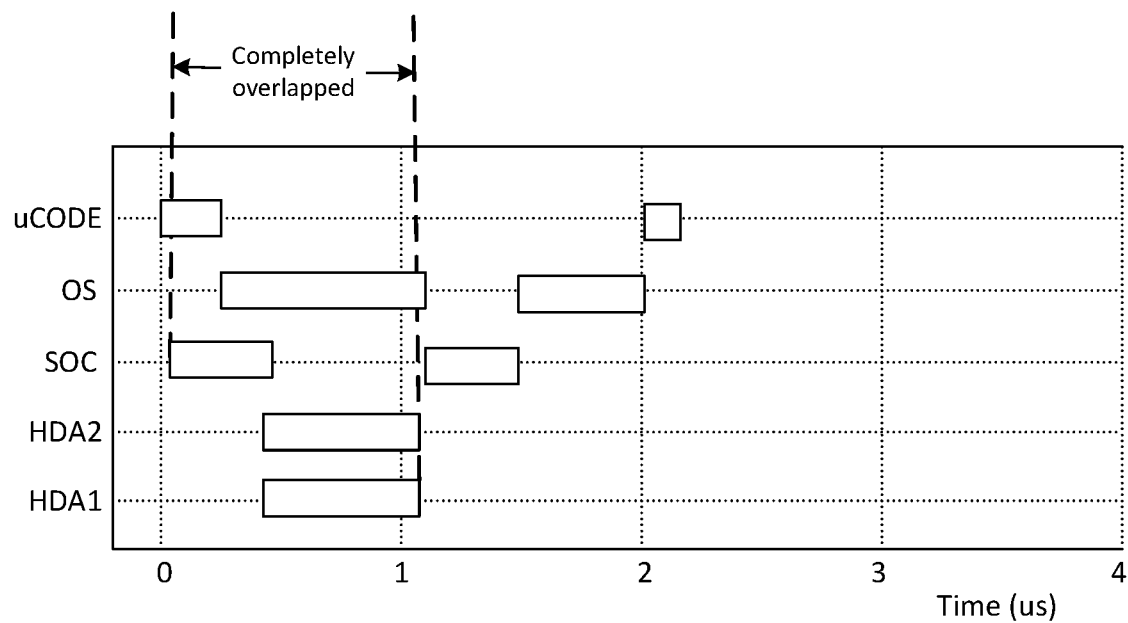

As shown in FIG. 1B, some embodiments provide technology to reduce the latency of the page fault processing by allowing some of these serialized operations to be overlapped. With reference to FIG. 6A, an example illustrative diagram shows that the latency of decompress is not completely hidden under OS-pre. Additionally, or alternatively, some embodiments may also provide technology to provide improved or optimal latency via parallel decompression. Some processors may include or have access to multiple HDAs. For example, a decompression engine may include two or more decompress cores. With reference to FIG. 6B, an example illustrative diagram shows how some embodiments may utilize parallel decompress on fault to further reduce the latency.

Figure 7A:
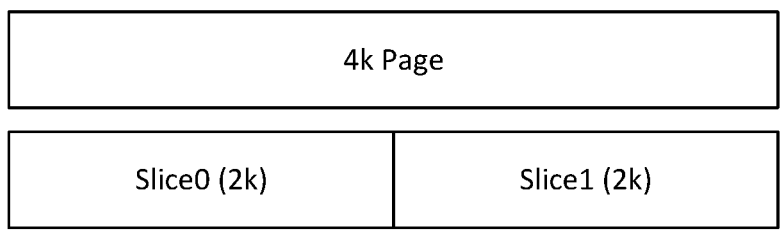
FIGS. 7A to 7B are illustrative diagrams of an example of a memory page and compressed data in accordance with some embodiments.
Figure 7B:
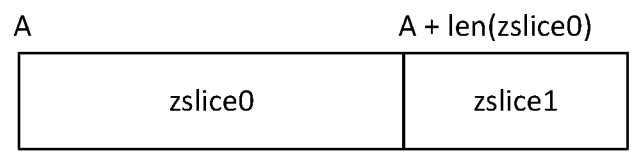

With reference to FIGS. 7A to 7B, an example memory page may store four (4) KB of uncompressed data. Some embodiments may treat a 4 KB page as two chunks or slices of 2 KB each (e.g., slice0 and slice1). In accordance with some embodiments, the microcode may be configured to compress the 4 KB page as two chunks, zslice0 and zslice1, and store the compressed chunks at a physical address A (e.g., in the compressed pool). FIG. 7B shows the compressed data stored at the physical address A in the compressed memory pool. Although various examples of parallel decompression are described in connection with a times-two (×2) configuration, embodiments may be extended in a natural way to higher degrees of parallelism.

Figure 8:
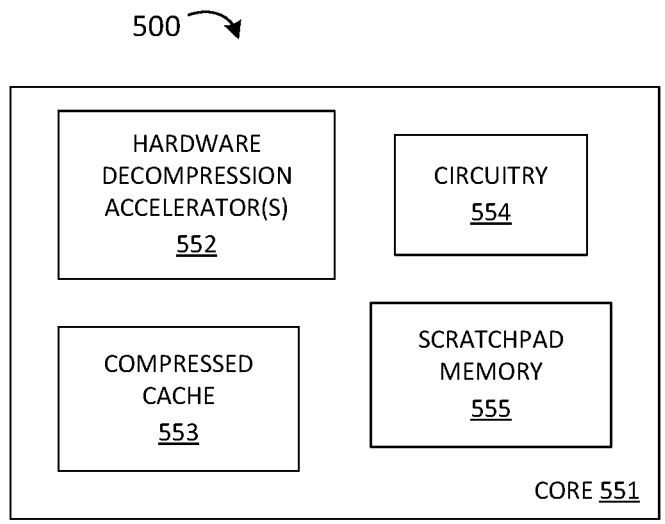
FIG. 8 is a block diagram of another example of an integrated circuit according to an embodiment.
Figure 9A:
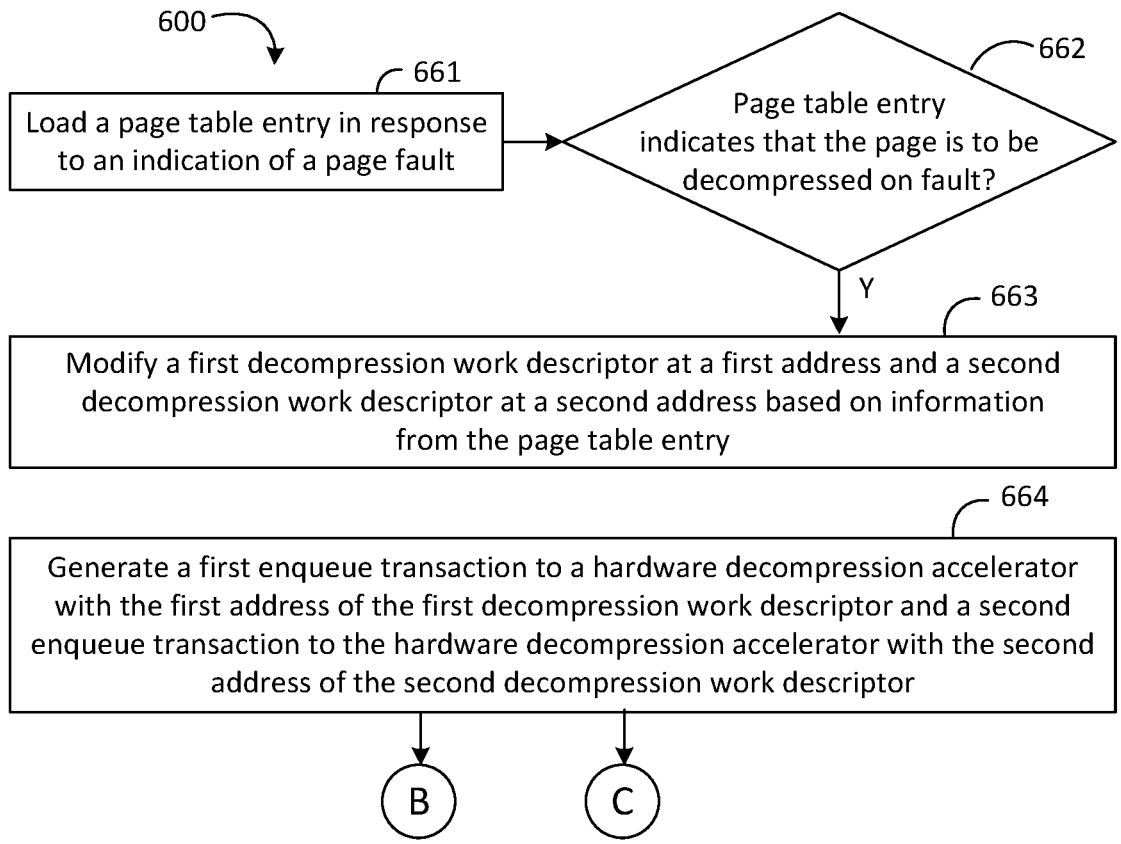
FIGS. 9A to 9D are flow diagrams of another example of a method according to an embodiment.
Figure 9B:
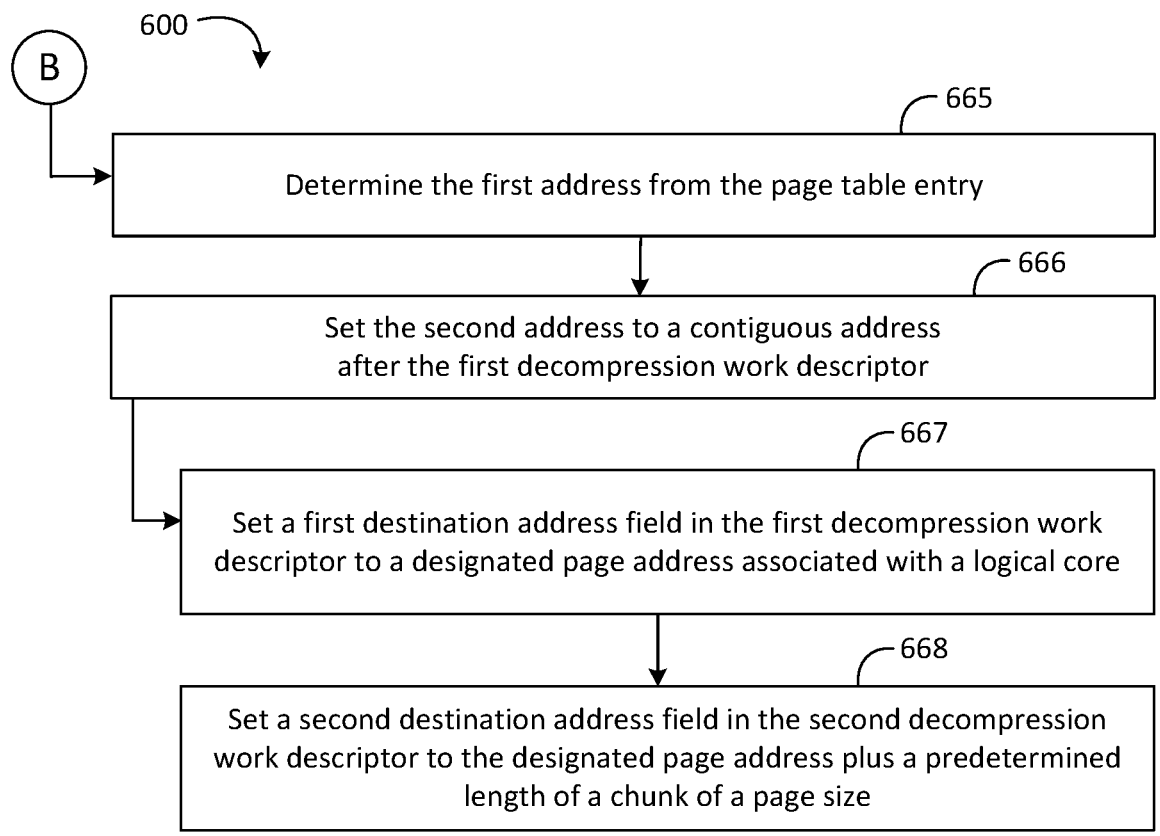
Figure 9C:
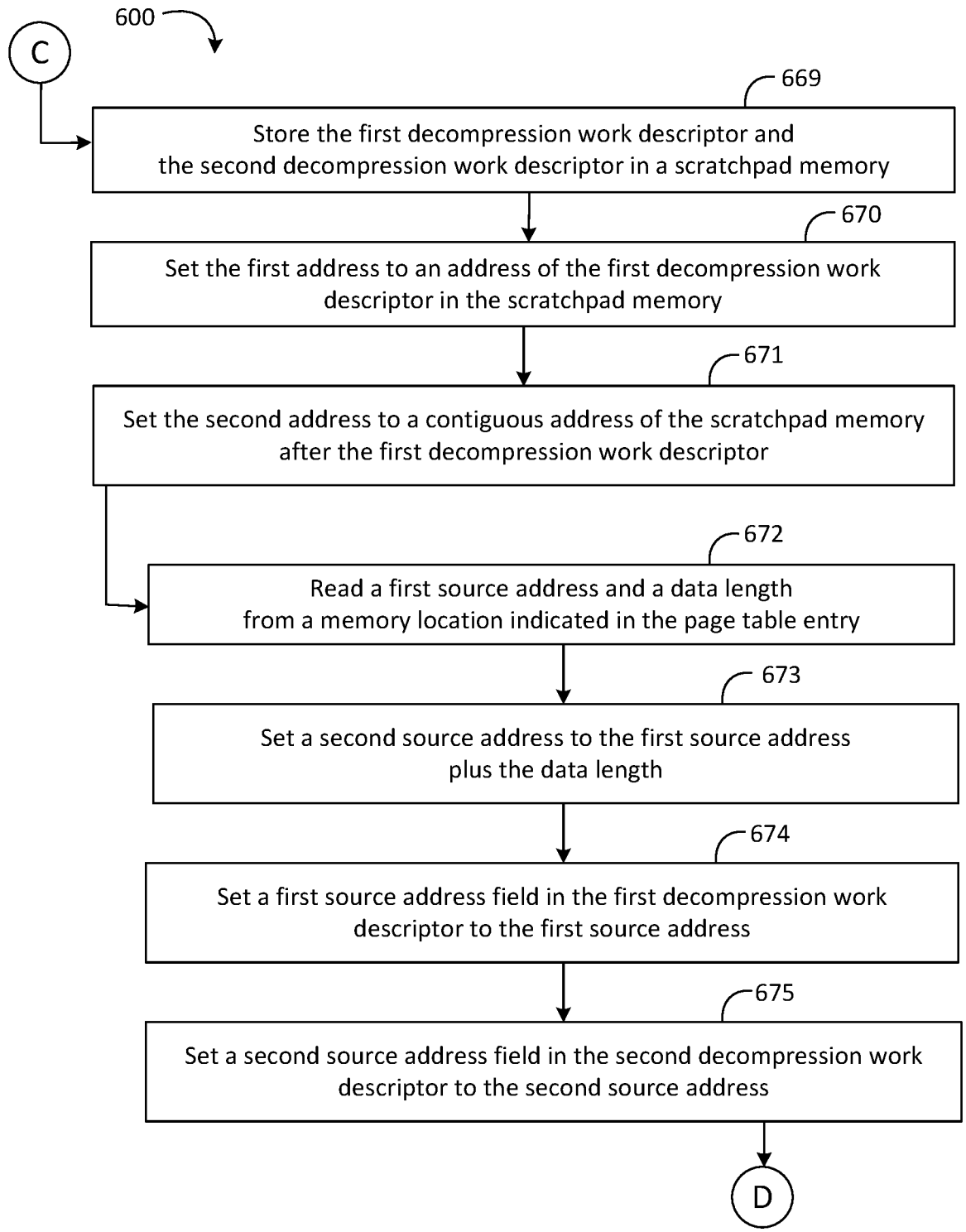
Figure 9D:
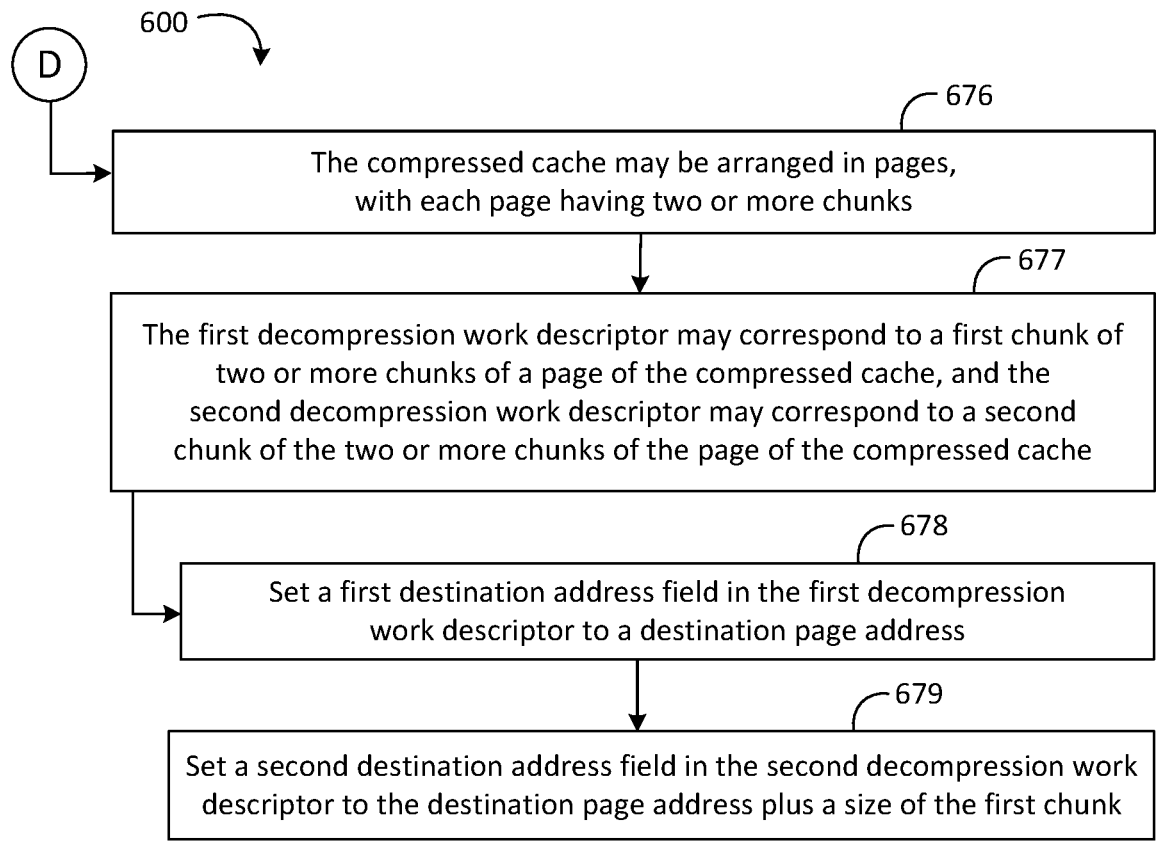

With reference to FIG. 8, an integrated circuit 500 may include a core 551, one or more hardware decompression accelerator(s) 552 coupled to the core 551, a compressed cache 553 coupled to the core 551, and circuitry 554 coupled to the core 551 and communicatively coupled to the hardware decompression accelerator 552 and the compressed cache 553. The circuitry 554 may be configured to load a page table entry in response to an indication of a page fault, determine if the page table entry indicates that the page is to be decompressed on fault, and, if so determined, modify a first decompression work descriptor at a first address and a second decompression work descriptor at a second address based on information from the page table entry, and generate a first enqueue transaction to the hardware decompression accelerator(s) 552 with the first address of the first decompression work descriptor and a second enqueue transaction to the hardware decompression accelerator(s) 552 with the second address of the second decompression work descriptor.

In some embodiments, the circuitry 554 may be further configured to determine the first address from the page table entry, and set the second address to a contiguous address after the first decompression work descriptor. The circuitry 554 may also be configured to set a first destination address field in the first decompression work descriptor to a designated page address associated with a logical core, and set a second destination address field in the second decompression work descriptor to the designated page address plus a predetermined length of a chunk of a page size.

In some embodiments, the integrated circuit 500 may further include a scratchpad memory 555 coupled to the core 551 and communicatively coupled to the circuitry 554. The circuitry 554 may be configured to store the first decompression work descriptor and the second decompression work descriptor in the scratchpad memory 555, set the first address to an address of the first decompression work descriptor in the scratchpad memory 555, and set the second address to a contiguous address of the scratchpad memory 555 after the first decompression work descriptor. In some embodiments, the circuitry 554 may also be configured to read a first source address and a data length from a memory location indicated in the page table entry, set a second source address to the first source address plus the data length, set a first source address field in the first decompression work descriptor to the first source address, and set a second source address field in the second decompression work descriptor to the second source address. For example, the compressed cache 553 may be arranged in pages, with each page having two or more chunks. The first decompression work descriptor may correspond to a first chunk of two or more chunks of a page of the compressed cache 553, and the second decompression work descriptor may correspond to a second chunk of the two or more chunks of the page of the compressed cache 553.

In some embodiments, the circuitry 554 may be further configured to set a first destination address field in the first decompression work descriptor to a destination page address, and set a second destination address field in the second decompression work descriptor to the destination page address plus a size of the first chunk. Those skilled in the art will appreciate that the circuitry 554 may include appropriately configured logic circuits, state machines, etc. Additionally, or alternatively, some or all of the circuitry 554 may be implemented with appropriate microcode instructions which, when executed by a processor, cause the processor to perform the various functions of the circuitry 554.

Embodiments of the hardware decompression accelerator 552, the compressed cache 553, the circuitry 554, and/or the scratchpad memory 555 may be incorporated in a processor including, for example, the core 990 (FIG. 13B), the cores 1102A-N (FIGS. 15, 19), the processor 1210 (FIG. 16), the co-processor 1245 (FIG. 16), the processor 1370 (FIGS. 17-18), the processor/coprocessor 1380 (FIGS. 17-18), the coprocessor 1338 (FIGS. 17-18), the coprocessor 1520 (FIG. 19), and/or the processors 1614, 1616 (FIG. 20).

With reference to FIGS. 9A to 9D, an embodiment of a method 600 may include loading a page table entry in response to an indication of a page fault at box 661, determining if the page table entry indicates that the page is to be decompressed on fault at box 662 and, if so determined, modifying a first decompression work descriptor at a first address and a second decompression work descriptor at a second address based on information from the page table entry at box 663, and generating a first enqueue transaction to a hardware decompression accelerator with the first address of the first decompression work descriptor and a second enqueue transaction to the hardware decompression accelerator with the second address of the second decompression work descriptor at box 664.

Some embodiments of the method 600 may further include determining the first address from the page table entry at box 665, and setting the second address to a contiguous address after the first decompression work descriptor at box 666. For example, the method 600 may further include setting a first destination address field in the first decompression work descriptor to a designated page address associated with a logical core at box 667, and setting a second destination address field in the second decompression work descriptor to the designated page address plus a predetermined length of a chunk of a page size at box 668.

Some embodiments of the method 600 may further include storing the first decompression work descriptor and the second decompression work descriptor in a scratchpad memory at box 669, setting the first address to an address of the first decompression work descriptor in the scratchpad memory at box 670, and setting the second address to a contiguous address of the scratchpad memory after the first decompression work descriptor at box 671. For example, the method 600 may also include reading a first source address and a data length from a memory location indicated in the page table entry at box 672, setting a second source address to the first source address plus the data length at box 673, setting a first source address field in the first decompression work descriptor to the first source address at box 674, and setting a second source address field in the second decompression work descriptor to the second source address at box 675.

In some embodiments, the compressed cache may be arranged in pages, with each page having two or more chunks at box 676. For example, the first decompression work descriptor may correspond to a first chunk of two or more chunks of a page of the compressed cache, and the second decompression work descriptor may correspond to a second chunk of the two or more chunks of the page of the compressed cache at box 677. Some embodiments of the method 600 may then further include setting a first destination address field in the first decompression work descriptor to a destination page address at box 678, and setting a second destination address field in the second decompression work descriptor to the destination page address plus a size of the first chunk at box 679.

Figure 10:
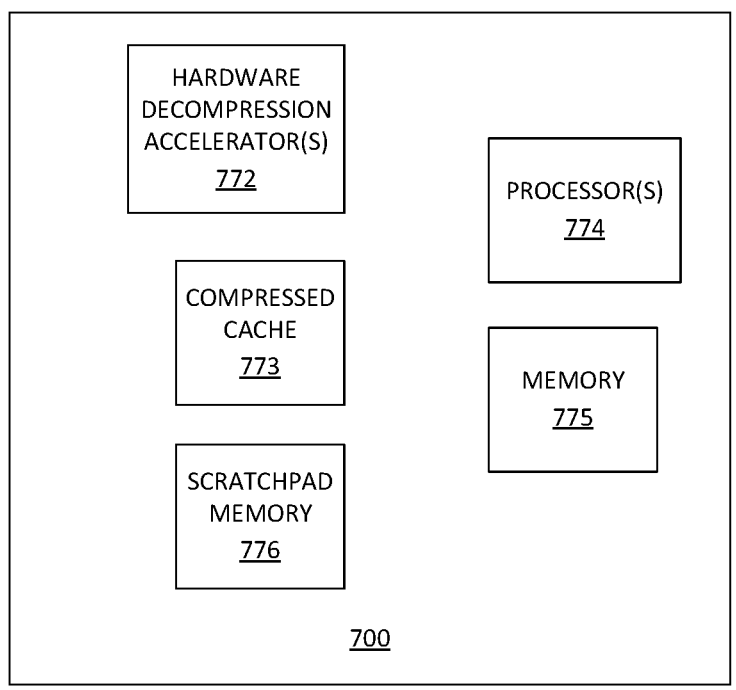
FIG. 10 is a block diagram of another example of an apparatus according to an embodiment.

With reference to FIG. 10, an embodiment of an apparatus 700 may include one or more hardware decompression accelerator(s) 772, a compressed cache 773, one or more processor(s) 774 communicatively coupled to the hardware decompression accelerator(s) 772 and the compressed cache 773, and memory 775 communicatively coupled to the processor(s) 774. The memory 775 may store microcode instructions that when executed by the processor(s) 774 causes the processor(s) 774 to load a page table entry in response to an indication of a page fault, determine if the page table entry indicates that the page is to be decompressed on fault, and, if so determined, modify a first decompression work descriptor at a first address and a second decompression work descriptor at a second address based on information from the page table entry, and generate a first enqueue transaction to the hardware decompression accelerator(s) 772 with the first address of the first decompression work descriptor and a second enqueue transaction to the hardware decompression accelerator(s) 772 with the second address of the second decompression work descriptor.

In some embodiments, the memory 775 may store further microcode instructions which when executed by the processor(s) 774 causes the processor(s) 774 to determine the first address from the page table entry, and set the second address to a contiguous address after the first decompression work descriptor. For example, the memory 775 may store further microcode instructions which when executed by the processor(s) 774 causes the processor(s) 774 to set a first destination address field in the first decompression work descriptor to a designated page address associated with a logical core, and set a second destination address field in the second decompression work descriptor to the designated page address entry plus a predetermined length of a chunk of a page size.

In some embodiments, the apparatus 700 may further include a scratchpad memory 776 communicatively coupled to the processor(s) 774 to store the first decompression work descriptor and the second decompression work descriptor, and the memory 775 may store further microcode instructions which when executed by the processor(s) 774 causes the processor(s) 774 to set the first address to an address of the first decompression work descriptor in the scratchpad memory 776, and set the second address to a contiguous address of the scratchpad memory 776 after the first decompression work descriptor. The memory 775 may also store microcode instructions which when executed by the processor(s) 774 causes the processor(s) 774 to read a first source address and a data length from a memory location indicated in the page table entry, set a second source address to the first source address plus the data length, set a first source address field in the first decompression work descriptor to the first source address, and set a second source address field in the second decompression work descriptor to the second source address. For example, the compressed cache 773 may be arranged in pages, with each page having two or more chunks. In some embodiments, the first decompression work descriptor may correspond to a first chunk of two or more chunks of a page of the compressed cache 773, and the second decompression work descriptor may correspond to a second chunk of the two or more chunks of the page of the compressed cache 773. In some embodiments, the memory 775 may store further microcode instructions which when executed by the processor(s) 774 causes the processor(s) 774 to set a first destination address field in the first decompression work descriptor to a destination page address, and set a second destination address field in the second decompression work descriptor to the destination page address plus a size of the first chunk.

Embodiments of the hardware decompression accelerator 772, the compressed cache 773, the memory 775, and/or the scratchpad memory 776 may be integrated with a processor including, for example, the core 990 (FIG. 13B), the cores 1102A-N (FIGS. 15, 19), the processor 1210 (FIG. 16), the co-processor 1245 (FIG. 16), the processor 1370 (FIGS. 17-18), the processor/coprocessor 1380 (FIGS. 17-18), the coprocessor 1338 (FIGS. 17-18), the coprocessor 1520 (FIG. 19), and/or the processors 1614, 1616 (FIG. 20).

With reference to FIGS. 11A to 11B, the OS may then create a pair of descriptors for the x2 decompress and store them contiguously at address D (e.g., in a LCC metadata region). The first descriptor has the source 1 address field set to the address A, the destination address field set to a nominally to-be-determined (TBD) value, the completion address record field set to TBD, and the maximum destination size field set to two (2) KB (e.g., 2048). The second descriptor has the source 1 address field set to A plus the length of slice0 (e.g., len(slice0) corresponds to the compressed size of the first chunk), the destination address field set to TBD+2048, the completion address record field set to TBD, and the maximum destination size field set to two (2) KB. The OS then stores the address D in the PTE (e.g., instead of the address A as described above in connection with the decompress on fault examples), which enables parallel decompression. On a miss, the microcode reads D, replaces TBD with the core's designated page address in both descriptor fields. And then submits two ENQ transactions with D and D+64 as the addresses of the descriptors. Advantageously, some embodiments may provide parallel decompression to further reduce latency. Some embodiments may hide the entire decompress operation under the OS-pre compute time.

For this example, with reference to FIG. 11B, the microcode page fault handler reads D from the PTE, and populates the TBD fields as follows. For the first descriptor, the microcode sets the destination address field set to the destination page address and sets the completion address record field set to the core cplrec0 value. For the second descriptor, the microcode sets the destination address field set to the destination page address plus 2048 and sets the completion address record field set to the core cplrec 1 value. After the first and second descriptors are updated with the appropriate values, the microcode submits two ENQ transactions with D and D+64 as the addresses of the descriptors. The separation of work may be needed because some fields are page and data specific (e.g., and populated by the OS during compress time), whereas others are core/thread specific which can only be handled dynamically by microcode when the fault happens.

With reference to FIGS. 12A to 12B, another embodiment of a data structure and descriptor may provide additional compression benefits for parallel compression. As described above in connection with FIGS. 11A to 11B, some embodiments provide technology for parallel decompress on fault that is simple and efficient from a microcode and performance perspective, but adds 128 B overhead (e.g., 2×64 B descriptors) to each compressed page. Some embodiments provide alternative technology for parallel decompression on fault that increases a compression ratio.

In accordance with some embodiments, each core is provided with a pair of descriptors in scratchpad memory. Instead of storing a pair of descriptors at address D, the OS may just store the data structure shown in FIG. 12A, which includes the address A and the length of zslice0. The address D is stored in the PTE. Note that the length of zslice1 (len(zslice1)) is not needed because the output size is known to be 2048. Advantageously, with this embodiment the overhead is about 10 bytes, which is about 10 times lower overhead per page as compared to storing the two descriptors at the address D.

On a miss, the microcode reads the address D from the PTE and creates the two descriptors in the scratchpad memory contiguously at address SP. The fields are filled in as described above in connection with FIG. 11B. All other fields are simple calculations that the microcode can perform as it fills out the two descriptors it in the scratchpad memory. The page fault handler flow is similar, but with more fields to be filled by the microcode. After the first and second descriptors in the scratchpad memory are updated with the appropriate values, the microcode submits two ENQ transactions with SP and SP+64 as the addresses of the descriptors.

Those skilled in the art will appreciate that a wide variety of devices may benefit from the foregoing embodiments. The following exemplary core architectures, processors, and computer architectures are non-limiting examples of devices that may beneficially incorporate embodiments of the technology described herein.

Exemplary Core Architectures, Processors, and Computer Architectures

Processor cores may be implemented in different ways, for different purposes, and in different processors. For instance, implementations of such cores may include: 1) a general purpose in-order core intended for general-purpose computing; 2) a high performance general purpose out-of-order core intended for general-purpose computing; 3) a special purpose core intended primarily for graphics and/or scientific (throughput) computing. Implementations of different processors may include: 1) a CPU including one or more general purpose in-order cores intended for general-purpose computing and/or one or more general purpose out-of-order cores intended for general-purpose computing; and 2) a coprocessor including one or more special purpose cores intended primarily for graphics and/or scientific (throughput). Such different processors lead to different computer system architectures, which may include: 1) the coprocessor on a separate chip from the CPU; 2) the coprocessor on a separate die in the same package as a CPU; 3) the coprocessor on the same die as a CPU (in which case, such a coprocessor is sometimes referred to as special purpose logic, such as integrated graphics and/or scientific (throughput) logic, or as special purpose cores); and 4) a system on a chip that may include on the same die the described CPU (sometimes referred to as the application core(s) or application processor(s)), the above described coprocessor, and additional functionality. Exemplary core architectures are described next, followed by descriptions of exemplary processors and computer architectures.

Exemplary Core Architectures

In-Order and Out-of-Order Core Block Diagram

FIG. 13A is a block diagram illustrating both an exemplary in-order pipeline and an exemplary register renaming, out-of-order issue/execution pipeline according to embodiments of the invention. FIG. 13B is a block diagram illustrating both an exemplary embodiment of an in-order architecture core and an exemplary register renaming, out-of-order issue/execution architecture core to be included in a processor according to embodiments of the invention. The solid lined boxes in FIGS. 13A-B illustrate the in-order pipeline and in-order core, while the optional addition of the dashed lined boxes illustrates the register renaming, out-of-order issue/execution pipeline and core. Given that the in-order aspect is a subset of the out-of-order aspect, the out-of-order aspect will be described.

In FIG. 13A, a processor pipeline 900 includes a fetch stage 902, a length decode stage 904, a decode stage 906, an allocation stage 908, a renaming stage 910, a scheduling (also known as a dispatch or issue) stage 912, a register read/memory read stage 914, an execute stage 916, a write back/memory write stage 918, an exception handling stage 922, and a commit stage 924.

FIG. 13B shows processor core 990 including a front end unit 930 coupled to an execution engine unit 950, and both are coupled to a memory unit 970. The core 990 may be a reduced instruction set computing (RISC) core, a complex instruction set computing (CISC) core, a very long instruction word (VLIW) core, or a hybrid or alternative core type. As yet another option, the core 990 may be a special-purpose core, such as, for example, a network or communication core, compression engine, coprocessor core, general purpose computing graphics processing unit (GPGPU) core, graphics core, or the like.

The front end unit 930 includes a branch prediction unit 932 coupled to an instruction cache unit 934, which is coupled to an instruction translation lookaside buffer (TLB) 936, which is coupled to an instruction fetch unit 938, which is coupled to a decode unit 940. The decode unit 940 (or decoder) may decode instructions, and generate as an output one or more micro-operations, micro-code entry points, microinstructions, other instructions, or other control signals, which are decoded from, or which otherwise reflect, or are derived from, the original instructions. The decode unit 940 may be implemented using various different mechanisms. Examples of suitable mechanisms include, but are not limited to, look-up tables, hardware implementations, programmable logic arrays (PLAs), microcode read only memories (ROMs), etc. In one embodiment, the core 990 includes a microcode ROM or other medium that stores microcode for certain macroinstructions (e.g., in decode unit 940 or otherwise within the front end unit 930). The decode unit 940 is coupled to a rename/allocator unit 952 in the execution engine unit 950.

The execution engine unit 950 includes the rename/allocator unit 952 coupled to a retirement unit 954 and a set of one or more scheduler unit(s) 956. The scheduler unit(s) 956 represents any number of different schedulers, including reservations stations, central instruction window, etc. The scheduler unit(s) 956 is coupled to the physical register file(s) unit(s) 958. Each of the physical register file(s) units 958 represents one or more physical register files, different ones of which store one or more different data types, such as scalar integer, scalar floating point, packed integer, packed floating point, vector integer, vector floating point, status (e.g., an instruction pointer that is the address of the next instruction to be executed), etc. In one embodiment, the physical register file(s) unit 958 comprises a vector registers unit, a write mask registers unit, and a scalar registers unit. These register units may provide architectural vector registers, vector mask registers, and general purpose registers. The physical register file(s) unit(s) 958 is overlapped by the retirement unit 954 to illustrate various ways in which register renaming and out-of-order execution may be implemented (e.g., using a reorder buffer(s) and a retirement register file(s); using a future file(s), a history buffer(s), and a retirement register file(s); using a register maps and a pool of registers; etc.). The retirement unit 954 and the physical register file(s) unit(s) 958 are coupled to the execution cluster(s) 960. The execution cluster(s) 960 includes a set of one or more execution units 962 and a set of one or more memory access units 964. The execution units 962 may perform various operations (e.g., shifts, addition, subtraction, multiplication) and on various types of data (e.g., scalar floating point, packed integer, packed floating point, vector integer, vector floating point). While some embodiments may include a number of execution units dedicated to specific functions or sets of functions, other embodiments may include only one execution unit or multiple execution units that all perform all functions. The scheduler unit(s) 956, physical register file(s) unit(s) 958, and execution cluster(s) 960 are shown as being possibly plural because certain embodiments create separate pipelines for certain types of data/operations (e.g., a scalar integer pipeline, a scalar floating point/packed integer/packed floating point/vector integer/vector floating point pipeline, and/or a memory access pipeline that each have their own scheduler unit, physical register file(s) unit, and/or execution cluster—and in the case of a separate memory access pipeline, certain embodiments are implemented in which only the execution cluster of this pipeline has the memory access unit(s) 964). It should also be understood that where separate pipelines are used, one or more of these pipelines may be out-of-order issue/execution and the rest in-order.

The set of memory access units 964 is coupled to the memory unit 970, which includes a data TLB unit 972 coupled to a data cache unit 974 coupled to a level 2 (L2) cache unit 976. In one exemplary embodiment, the memory access units 964 may include a load unit, a store address unit, and a store data unit, each of which is coupled to the data TLB unit 972 in the memory unit 970. The instruction cache unit 934 is further coupled to a level 2 (L2) cache unit 976 in the memory unit 970. The L2 cache unit 976 is coupled to one or more other levels of cache and eventually to a main memory.

By way of example, the exemplary register renaming, out-of-order issue/execution core architecture may implement the pipeline 900 as follows: 1) the instruction fetch 938 performs the fetch and length decoding stages 902 and 904; 2) the decode unit 940 performs the decode stage 906; 3) the rename/allocator unit 952 performs the allocation stage 908 and renaming stage 910; 4) the scheduler unit(s) 956 performs the schedule stage 912; 5) the physical register file(s) unit(s) 958 and the memory unit 970 perform the register read/memory read stage 914; the execution cluster 960 perform the execute stage 916; 6) the memory unit 970 and the physical register file(s) unit(s) 958 perform the write back/memory write stage 918; 7) various units may be involved in the exception handling stage 922; and 8) the retirement unit 954 and the physical register file(s) unit(s) 958 perform the commit stage 924.

The core 990 may support one or more instructions sets (e.g., the x86 instruction set (with some extensions that have been added with newer versions); the MIPS instruction set of MIPS Technologies of Sunnyvale, CA; the ARM instruction set (with optional additional extensions such as NEON) of ARM Holdings of Sunnyvale, CA), including the instruction(s) described herein. In one embodiment, the core 990 includes logic to support a packed data instruction set extension (e.g., AVX1, AVX2), thereby allowing the operations used by many multimedia applications to be performed using packed data.

It should be understood that the core may support multithreading (executing two or more parallel sets of operations or threads), and may do so in a variety of ways including time sliced multithreading, simultaneous multithreading (where a single physical core provides a logical core for each of the threads that physical core is simultaneously multithreading), or a combination thereof (e.g., time sliced fetching and decoding and simultaneous multithreading thereafter such as in the Intel® Hyperthreading technology).

While register renaming is described in the context of out-of-order execution, it should be understood that register renaming may be used in an in-order architecture. While the illustrated embodiment of the processor also includes separate instruction and data cache units 934/974 and a shared L2 cache unit 976, alternative embodiments may have a single internal cache for both instructions and data, such as, for example, a Level 1 (L1) internal cache, or multiple levels of internal cache. In some embodiments, the system may include a combination of an internal cache and an external cache that is external to the core and/or the processor. Alternatively, all of the cache may be external to the core and/or the processor.

Specific Exemplary In-Order Core Architecture

FIGS. 14A-B illustrate a block diagram of a more specific exemplary in-order core architecture, which core would be one of several logic blocks (including other cores of the same type and/or different types) in a chip. The logic blocks communicate through a high-bandwidth interconnect network (e.g., a ring network) with some fixed function logic, memory I/O interfaces, and other necessary I/O logic, depending on the application.

FIG. 14A is a block diagram of a single processor core, along with its connection to the on-die interconnect network 1002 and with its local subset of the Level 2 (L2) cache 1004, according to embodiments of the invention. In one embodiment, an instruction decoder 1000 supports the x86 instruction set with a packed data instruction set extension. An L1 cache 1006 allows low-latency accesses to cache memory into the scalar and vector units. While in one embodiment (to simplify the design), a scalar unit 1008 and a vector unit 1010 use separate register sets (respectively, scalar registers 1012 and vector registers 1014) and data transferred between them is written to memory and then read back in from a level 1 (L1) cache 1006, alternative embodiments of the invention may use a different approach (e.g., use a single register set or include a communication path that allow data to be transferred between the two register files without being written and read back).

The local subset of the L2 cache 1004 is part of a global L2 cache that is divided into separate local subsets, one per processor core. Each processor core has a direct access path to its own local subset of the L2 cache 1004. Data read by a processor core is stored in its L2 cache subset 1004 and can be accessed quickly, in parallel with other processor cores accessing their own local L2 cache subsets. Data written by a processor core is stored in its own L2 cache subset 1004 and is flushed from other subsets, if necessary. The ring network ensures coherency for shared data. The ring network is bi-directional to allow agents such as processor cores, L2 caches and other logic blocks to communicate with each other within the chip. Each ring data-path is 1012-bits wide per direction.

FIG. 14B is an expanded view of part of the processor core in FIG. 14A according to embodiments of the invention. FIG. 14B includes an L1 data cache 1006 A part of the L1 cache 1006, as well as more detail regarding the vector unit 1010 and the vector registers 1014. Specifically, the vector unit 1010 is a 16-wide vector processing unit (VPU) (see the 16-wide ALU 1028), which executes one or more of integer, single-precision float, and double-precision float instructions. The VPU supports swizzling the register inputs with swizzle unit 1020, numeric conversion with numeric convert units 1022 A-B, and replication with replication unit 1024 on the memory input. Write mask registers 1026 allow predicating resulting vector writes.

Figure 15:
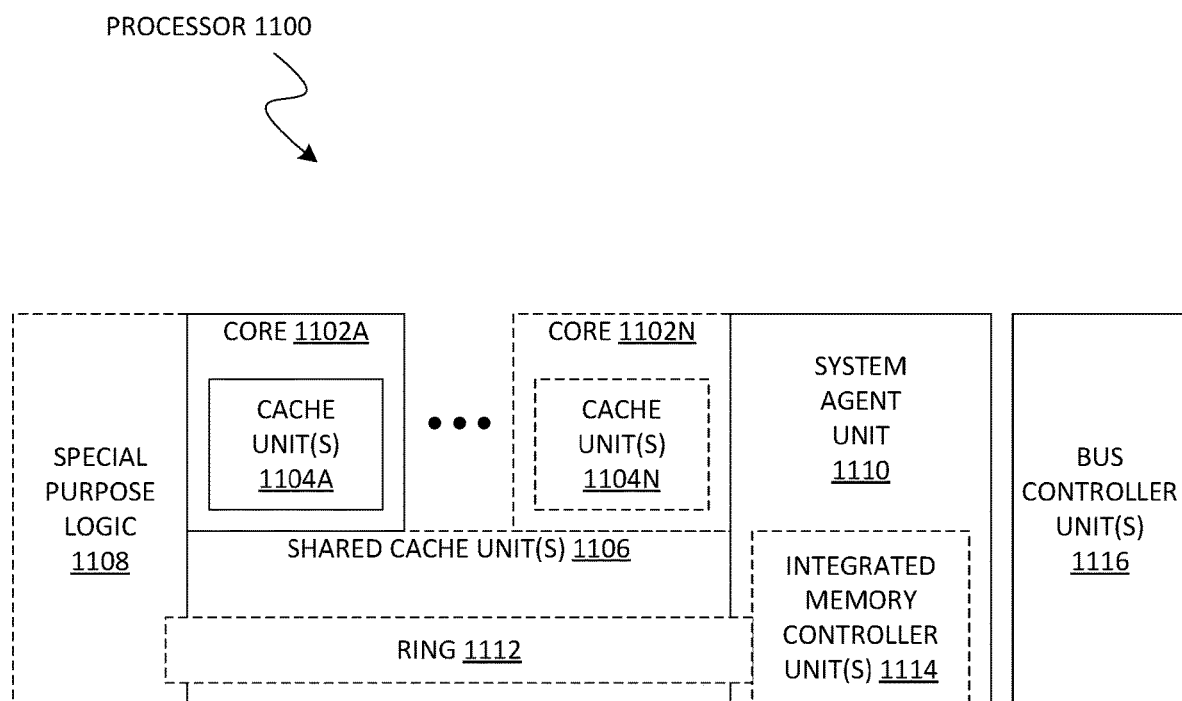
FIG. 15 is a block diagram of a processor that may have more than one core, may have an integrated memory controller, and may have integrated graphics according to embodiments of the invention.

FIG. 15 is a block diagram of a processor 1100 that may have more than one core, may have an integrated memory controller, and may have integrated graphics according to embodiments of the invention. The solid lined boxes in FIG. 15 illustrate a processor 1100 with a single core 1102 A, a system agent 1110, a set of one or more bus controller units 1116, while the optional addition of the dashed lined boxes illustrates an alternative processor 1100 with multiple cores 1102A-N, a set of one or more integrated memory controller unit(s) 1114 in the system agent unit 1110, and special purpose logic 1108.

Thus, different implementations of the processor 1100 may include: 1) a CPU with the special purpose logic 1108 being integrated graphics and/or scientific (throughput) logic (which may include one or more cores), and the cores 1102A-N being one or more general purpose cores (e.g., general purpose in-order cores, general purpose out-of-order cores, a combination of the two); 2) a coprocessor with the cores 1102A-N being a large number of special purpose cores intended primarily for graphics and/or scientific (throughput); and 3) a coprocessor with the cores 1102A-N being a large number of general purpose in-order cores. Thus, the processor 1100 may be a general-purpose processor, coprocessor or special-purpose processor, such as, for example, a network or communication processor, compression engine, graphics processor, GPGPU (general purpose graphics processing unit), a high-throughput many integrated core (MIC) coprocessor (including 30 or more cores), embedded processor, or the like. The processor may be implemented on one or more chips. The processor 1100 may be a part of and/or may be implemented on one or more substrates using any of a number of process technologies, such as, for example, BiCMOS, CMOS, or NMOS.

The memory hierarchy includes one or more levels of respective caches 1104A-N within the cores 1102A-N, a set or one or more shared cache units 1106, and external memory (not shown) coupled to the set of integrated memory controller units 1114. The set of shared cache units 1106 may include one or more mid-level caches, such as level 2 (L2), level 3 (L3), level 4 (L4), or other levels of cache, a last level cache (LLC), and/or combinations thereof. While in one embodiment a ring based interconnect unit 1112 interconnects the integrated graphics logic 1108, the set of shared cache units 1106, and the system agent unit 1110/integrated memory controller unit(s) 1114, alternative embodiments may use any number of well-known techniques for interconnecting such units. In one embodiment, coherency is maintained between one or more cache units 1106 and cores 1102-A-N.

In some embodiments, one or more of the cores 1102A-N are capable of multithreading. The system agent 1110 includes those components coordinating and operating cores 1102A-N. The system agent unit 1110 may include for example a power control unit (PCU) and a display unit. The PCU may be or include logic and components needed for regulating the power state of the cores 1102A-N and the integrated graphics logic 1108. The display unit is for driving one or more externally connected displays.

The cores 1102A-N may be homogenous or heterogeneous in terms of architecture instruction set; that is, two or more of the cores 1102A-N may be capable of execution the same instruction set, while others may be capable of executing only a subset of that instruction set or a different instruction set.

Exemplary Computer Architectures

FIGS. 16-19 are block diagrams of exemplary computer architectures. Other system designs and configurations known in the arts for laptops, desktops, handheld PCs, personal digital assistants, engineering workstations, servers, network devices, network hubs, switches, embedded processors, digital signal processors (DSPs), graphics devices, video game devices, set-top boxes, micro controllers, cell phones, portable media players, hand held devices, and various other electronic devices, are also suitable. In general, a huge variety of systems or electronic devices capable of incorporating a processor and/or other execution logic as disclosed herein are generally suitable.

Figure 16:
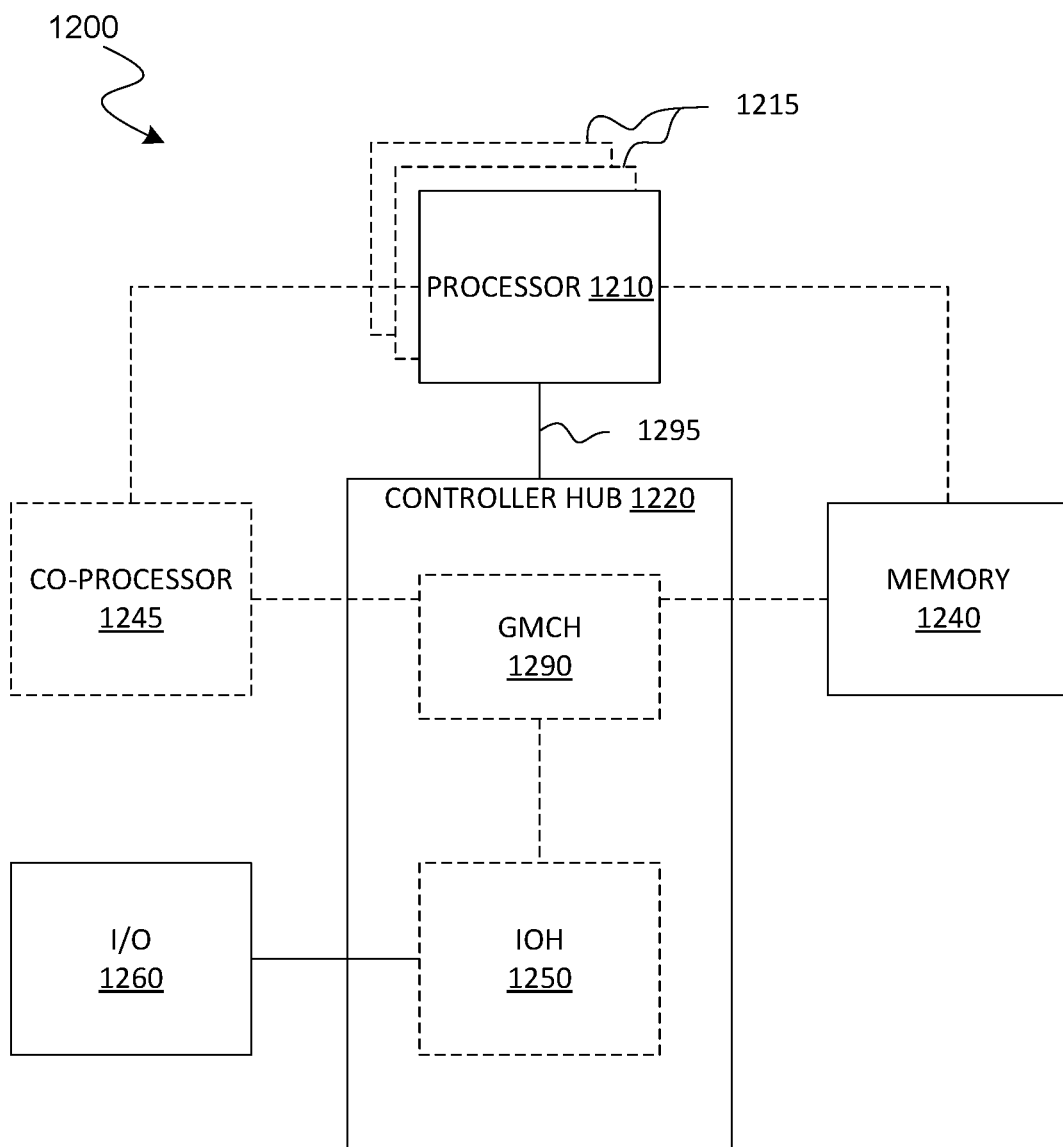
FIGS. 16-19 are block diagrams of exemplary computer architectures.

Referring now to FIG. 16, shown is a block diagram of a system 1200 in accordance with one embodiment of the present invention. The system 1200 may include one or more processors 1210, 1215, which are coupled to a controller hub 1220. In one embodiment the controller hub 1220 includes a graphics memory controller hub (GMCH) 1290 and an Input/Output Hub (IOH) 1250 (which may be on separate chips); the GMCH 1290 includes memory and graphics controllers to which are coupled memory 1240 and a coprocessor 1245; the IOH 1250 couples input/output (I/O) devices 1260 to the GMCH 1290. Alternatively, one or both of the memory and graphics controllers are integrated within the processor (as described herein), the memory 1240 and the coprocessor 1245 are coupled directly to the processor 1210, and the controller hub 1220 in a single chip with the IOH 1250.

The optional nature of additional processors 1215 is denoted in FIG. 16 with broken lines. Each processor 1210, 1215 may include one or more of the processing cores described herein and may be some version of the processor 1100.

The memory 1240 may be, for example, dynamic random access memory (DRAM), phase change memory (PCM), or a combination of the two. For at least one embodiment, the controller hub 1220 communicates with the processor(s) 1210, 1215 via a multi-drop bus, such as a frontside bus (FSB), point-to-point interface such as QuickPath Interconnect (QPI), or similar connection 1295.

In one embodiment, the coprocessor 1245 is a special-purpose processor, such as, for example, a high-throughput MIC processor, a network or communication processor, compression engine, graphics processor, GPGPU, embedded processor, or the like. In one embodiment, controller hub 1220 may include an integrated graphics accelerator.

There can be a variety of differences between the physical resources 1210, 1215 in terms of a spectrum of metrics of merit including architectural, microarchitectural, thermal, power consumption characteristics, and the like.

In one embodiment, the processor 1210 executes instructions that control data processing operations of a general type. Embedded within the instructions may be coprocessor instructions. The processor 1210 recognizes these coprocessor instructions as being of a type that should be executed by the attached coprocessor 1245. Accordingly, the processor 1210 issues these coprocessor instructions (or control signals representing coprocessor instructions) on a coprocessor bus or other interconnect, to coprocessor 1245. Coprocessor(s) 1245 accept and execute the received coprocessor instructions.

Figure 17:
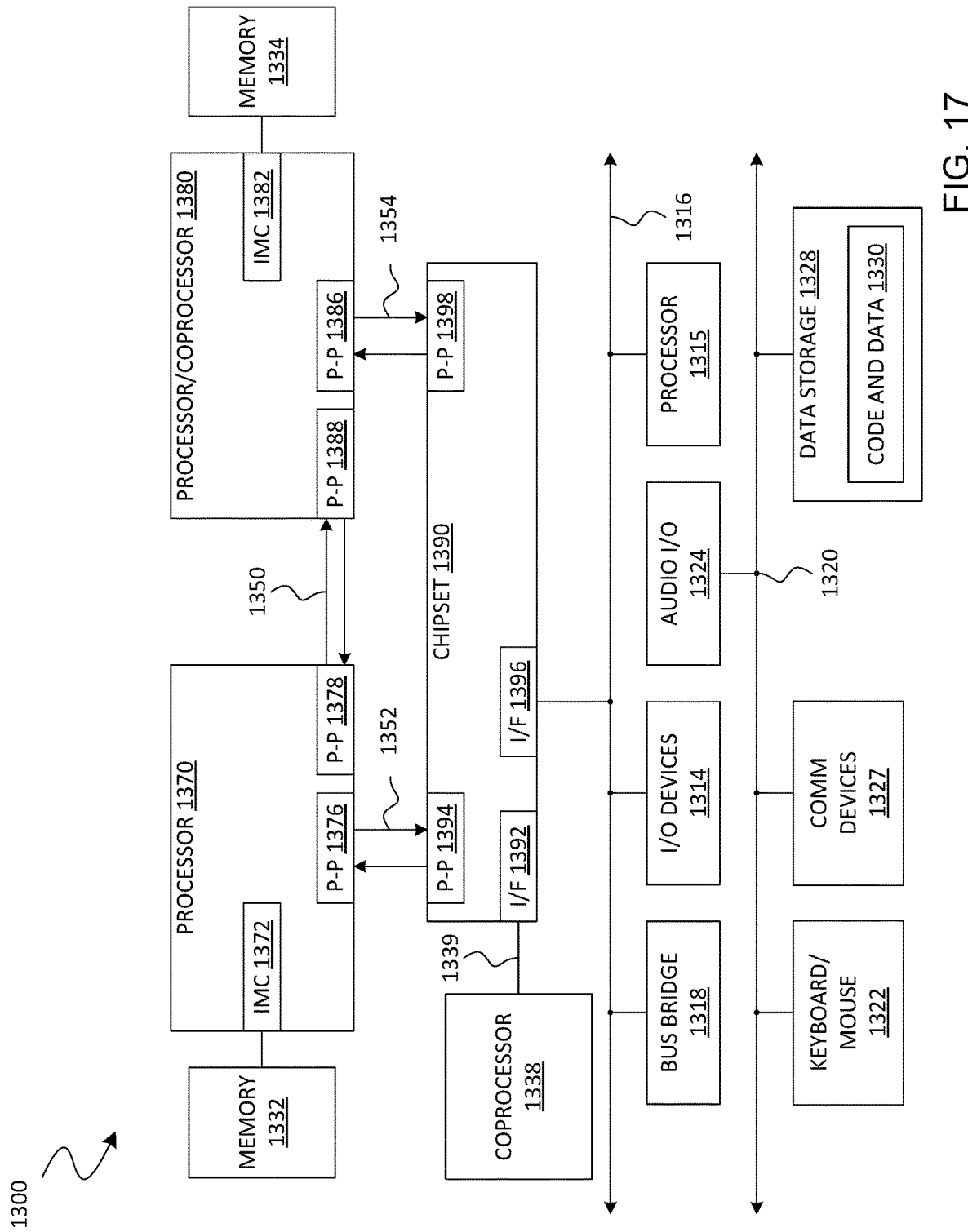

Referring now to FIG. 17, shown is a block diagram of a first more specific exemplary system 1300 in accordance with an embodiment of the present invention. As shown in FIG. 17, multiprocessor system 1300 is a point-to-point interconnect system, and includes a first processor 1370 and a second processor 1380 coupled via a point-to-point interconnect 1350. Each of processors 1370 and 1380 may be some version of the processor 1100. In one embodiment of the invention, processors 1370 and 1380 are respectively processors 1210 and 1215, while coprocessor 1338 is coprocessor 1245. In another embodiment, processors 1370 and 1380 are respectively processor 1210 coprocessor 1245.

Processors 1370 and 1380 are shown including integrated memory controller (IMC) units 1372 and 1382, respectively. Processor 1370 also includes as part of its bus controller units point-to-point (P-P) interfaces 1376 and 1378; similarly, second processor 1380 includes P-P interfaces 1386 and 1388. Processors 1370, 1380 may exchange information via a point-to-point (P-P) interface 1350 using P-P interface circuits 1378, 1388. As shown in FIG. 17, IMCs 1372 and 1382 couple the processors to respective memories, namely a memory 1332 and a memory 1334, which may be portions of main memory locally attached to the respective processors.

Processors 1370, 1380 may each exchange information with a chipset 1390 via individual P-P interfaces 1352, 1354 using point to point interface circuits 1376, 1394, 1386, 1398. Chipset 1390 may optionally exchange information with the coprocessor 1338 via a high-performance interface 1339 and an interface 1392. In one embodiment, the coprocessor 1338 is a special-purpose processor, such as, for example, a high-throughput MIC processor, a network or communication processor, compression engine, graphics processor, GPGPU, embedded processor, or the like.

A shared cache (not shown) may be included in either processor or outside of both processors, yet connected with the processors via P-P interconnect, such that either or both processors' local cache information may be stored in the shared cache if a processor is placed into a low power mode.

Chipset 1390 may be coupled to a first bus 1316 via an interface 1396. In one embodiment, first bus 1316 may be a Peripheral Component Interconnect (PCI) bus, or a bus such as a PCI Express bus or another third generation I/O interconnect bus, although the scope of the present invention is not so limited.

As shown in FIG. 17, various I/O devices 1314 may be coupled to first bus 1316, along with a bus bridge 1318 which couples first bus 1316 to a second bus 1320. In one embodiment, one or more additional processor(s) 1315, such as coprocessors, high-throughput MIC processors, GPGPU's, accelerators (such as, e.g., graphics accelerators or digital signal processing (DSP) units), field programmable gate arrays, or any other processor, are coupled to first bus 1316. In one embodiment, second bus 1320 may be a low pin count (LPC) bus. Various devices may be coupled to a second bus 1320 including, for example, a keyboard and/or mouse 1322, communication devices 1327 and a storage unit 1328 such as a disk drive or other mass storage device which may include instructions/code and data 1330, in one embodiment. Further, an audio I/O 1324 may be coupled to the second bus 1320. Note that other architectures are possible. For example, instead of the point-to-point architecture of FIG. 17, a system may implement a multi-drop bus or other such architecture.

Figure 18:
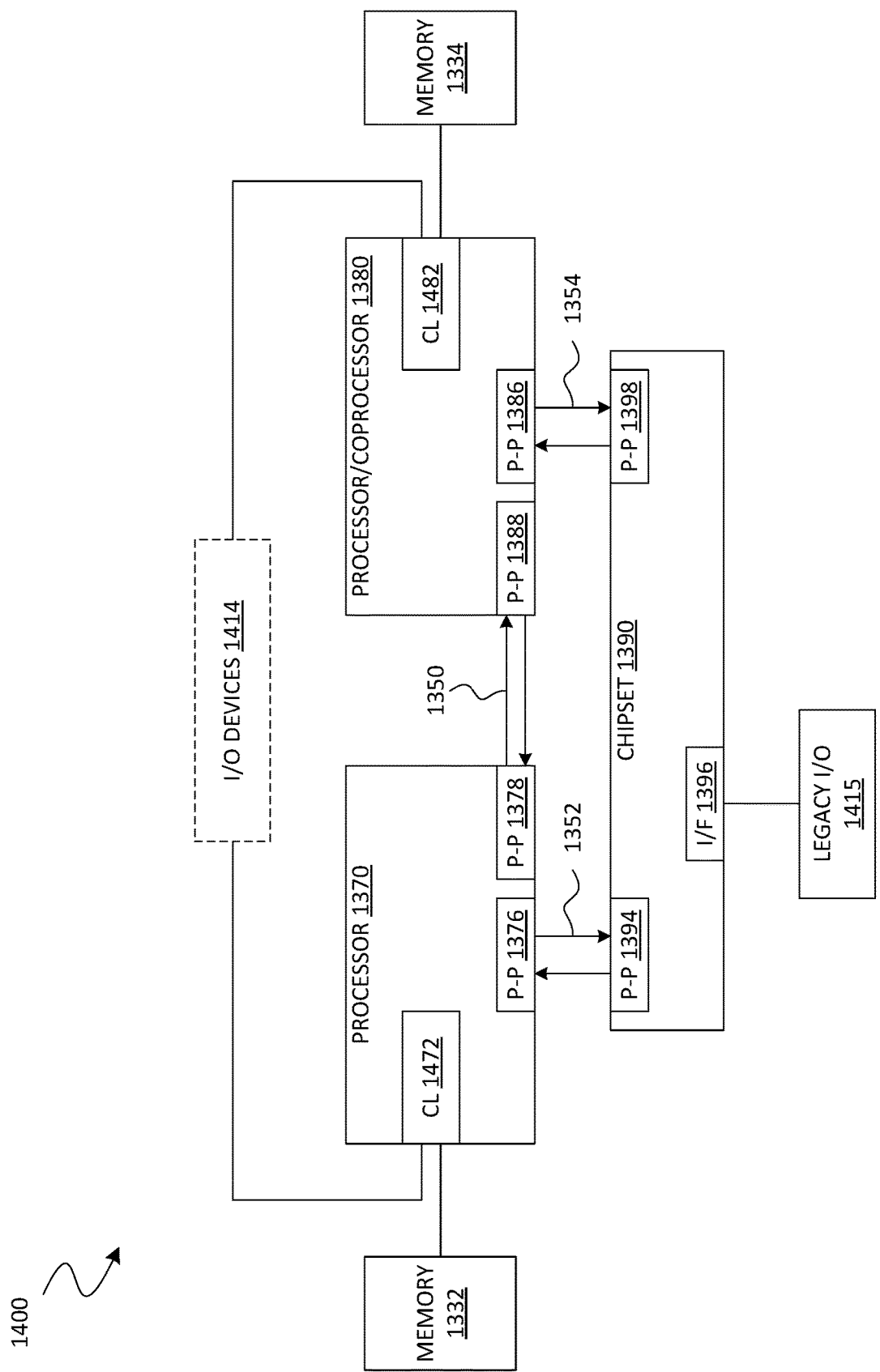

Referring now to FIG. 18, shown is a block diagram of a second more specific exemplary system 1400 in accordance with an embodiment of the present invention Like elements in FIGS. 17 and 18 bear like reference numerals, and certain aspects of FIG. 17 have been omitted from FIG. 18 in order to avoid obscuring other aspects of FIG. 18.

FIG. 18 illustrates that the processors 1370, 1380 may include integrated memory and I/O control logic ("CL") 1472 and 1482, respectively. Thus, the CL 1472, 1482 include integrated memory controller units and include I/O control logic. FIG. 18 illustrates that not only are the memories 1332, 1334 coupled to the CL 1472, 1482, but also that I/O devices 1414 are also coupled to the control logic 1472, 1482. Legacy I/O devices 1415 are coupled to the chipset 1390.

Referring now to FIG. 19, shown is a block diagram of a SoC 1500 in accordance with an embodiment of the present invention. Similar elements in FIG. 15 bear like reference numerals. Also, dashed lined boxes are optional features on more advanced SoCs. In FIG. 19, an interconnect unit(s) 1502 is coupled to: an application processor 1510 which includes a set of one or more cores 1102A-N and shared cache unit(s) 1106; a system agent unit 1110; a bus controller unit(s) 1116; an integrated memory controller unit(s) 1114; a set or one or more coprocessors 1520 which may include integrated graphics logic, an image processor, an audio processor, and a video processor; an static random access memory (SRAM) unit 1530; a direct memory access (DMA) unit 1532; and a display unit 1540 for coupling to one or more external displays. In one embodiment, the coprocessor(s) 1520 include a special-purpose processor, such as, for example, a network or communication processor, compression engine, GPGPU, a high-throughput MIC processor, embedded processor, or the like.

Embodiments of the mechanisms disclosed herein may be implemented in hardware, software, firmware, or a combination of such implementation approaches. Embodiments of the invention may be implemented as computer programs or program code executing on programmable systems comprising at least one processor, a storage system (including volatile and non-volatile memory and/or storage elements), at least one input device, and at least one output device.

Program code, such as code 1330 illustrated in FIG. 17, may be applied to input instructions to perform the functions described herein and generate output information. The output information may be applied to one or more output devices, in known fashion. For purposes of this application, a processing system includes any system that has a processor, such as, for example; a digital signal processor (DSP), a microcontroller, an application specific integrated circuit (ASIC), or a microprocessor.

The program code may be implemented in a high level procedural or object oriented programming language to communicate with a processing system. The program code may also be implemented in assembly or machine language, if desired. In fact, the mechanisms described herein are not limited in scope to any particular programming language. In any case, the language may be a compiled or interpreted language.

One or more aspects of at least one embodiment may be implemented by representative instructions stored on a machine-readable medium which represents various logic within the processor, which when read by a machine causes the machine to fabricate logic to perform the techniques described herein. Such representations, known as "IP cores" may be stored on a tangible, machine readable medium and supplied to various customers or manufacturing facilities to load into the fabrication machines that actually make the logic or processor.

Such machine-readable storage media may include, without limitation, non-transitory, tangible arrangements of articles manufactured or formed by a machine or device, including storage media such as hard disks, any other type of disk including floppy disks, optical disks, compact disk read-only memories (CD-ROMs), compact disk rewritable's (CD-RWs), and magneto-optical disks, semiconductor devices such as read-only memories (ROMs), random access memories (RAMs) such as dynamic random access memories (DRAMs), static random access memories (SRAMs), erasable programmable read-only memories (EPROMs), flash memories, electrically erasable programmable read-only memories (EEPROMs), phase change memory (PCM), magnetic or optical cards, or any other type of media suitable for storing electronic instructions.

Accordingly, embodiments of the invention also include non-transitory, tangible machine-readable media containing instructions or containing design data, such as Hardware Description Language (HDL), which defines structures, circuits, apparatuses, processors and/or system features described herein. Such embodiments may also be referred to as program products.

Emulation (including binary translation, code morphing, etc.)

In some cases, an instruction converter may be used to convert an instruction from a source instruction set to a target instruction set. For example, the instruction converter may translate (e.g., using static binary translation, dynamic binary translation including dynamic compilation), morph, emulate, or otherwise convert an instruction to one or more other instructions to be processed by the core. The instruction converter may be implemented in software, hardware, firmware, or a combination thereof. The instruction converter may be on processor, off processor, or part on and part off processor.

FIG. 20 is a block diagram contrasting the use of a software instruction converter to convert binary instructions in a source instruction set to binary instructions in a target instruction set according to embodiments of the invention. In the illustrated embodiment, the instruction converter is a software instruction converter, although alternatively the instruction converter may be implemented in software, firmware, hardware, or various combinations thereof. FIG. 20 shows a program in a high level language 1602 may be compiled using an x86 compiler 1604 to generate x86 binary code 1606 that may be natively executed by a processor with at least one x86 instruction set core 1616. The processor with at least one x86 instruction set core 1616 represents any processor that can perform substantially the same functions as an Intel processor with at least one x86 instruction set core by compatibly executing or otherwise processing (1) a substantial portion of the instruction set of the Intel x86 instruction set core or (2) object code versions of applications or other software targeted to run on an Intel processor with at least one x86 instruction set core, in order to achieve substantially the same result as an Intel processor with at least one x86 instruction set core. The x86 compiler 1604 represents a compiler that is operable to generate x86 binary code 1606 (e.g., object code) that can, with or without additional linkage processing, be executed on the processor with at least one x86 instruction set core 1616. Similarly, FIG. 20 shows the program in the high level language 1602 may be compiled using an alternative instruction set compiler 1608 to generate alternative instruction set binary code 1610 that may be natively executed by a processor without at least one x86 instruction set core 1614 (e.g., a processor with cores that execute the MIPS instruction set of MIPS Technologies of Sunnyvale, CA and/or that execute the ARM instruction set of ARM Holdings of Sunnyvale, CA). The instruction converter 1612 is used to convert the x86 binary code 1606 into code that may be natively executed by the processor without an x86 instruction set core 1614. This converted code is not likely to be the same as the alternative instruction set binary code 1610 because an instruction converter capable of this is difficult to make; however, the converted code will accomplish the general operation and be made up of instructions from the alternative instruction set. Thus, the instruction converter 1612 represents software, firmware, hardware, or a combination thereof that, through emulation, simulation or any other process, allows a processor or other electronic device that does not have an x86 instruction set processor or core to execute the x86 binary code 1606.

Techniques and architectures for instruction set architecture opcode parameterization are described herein. In the above description, for purposes of explanation, numerous specific details are set forth in order to provide a thorough understanding of certain embodiments. It will be apparent, however, to one skilled in the art that certain embodiments can be practiced without these specific details. In other instances, structures and devices are shown in block diagram form in order to avoid obscuring the description.

ADDITIONAL NOTES AND EXAMPLES

Example 1 includes an integrated circuit, comprising a core, a hardware decompression accelerator coupled to the core, a compressed cache coupled to the core, and circuitry coupled to the core and communicatively coupled to the hardware decompression accelerator and the compressed cache, the circuitry to store a first address to a decompression work descriptor, retrieve a second address where a compressed page is stored in the compressed cache from the decompression work descriptor at the first address in response to an indication of a page fault, and send instructions to the hardware decompression accelerator to decompress the compressed page at the second address.

Example 2 includes the integrated circuit of Example 1, further comprising scratchpad memory coupled to the core and communicatively coupled to the circuitry, wherein the circuitry is further to store the first address of the decompression work descriptor in the scratchpad memory, wherein the decompression work descriptor includes the second address that corresponds to a next page to decompress.

Example 3 includes the integrated circuit of Example 2, wherein the scratchpad memory comprises a model specific register that includes a field that indicates a logical processor associated with the model specific register.

Example 4 includes the integrated circuit of any of Examples 2 to 3, wherein the circuitry is further to load a page table entry that corresponds to a virtual address of a page that faulted, determine if the page table entry indicates that the page is to be decompressed on fault, and, if so determined, generate an enqueue transaction to the hardware decompression accelerator with a compressed page address from the page table entry as a source and the second address retrieved from the decompression work descriptor as a target.

Example 5 includes the integrated circuit of Example 4, wherein the circuitry is further to skip the generation of the enqueue transaction if the page table entry indicates that another decompress operation is queued.

Example 6 includes the integrated circuit of any of Examples 4 to 5, wherein the circuitry is further to skip the generation of the enqueue transaction if the decompress work descriptor with the address of the compressed page is determined to be invalid.

Example 7 includes the integrated circuit of any of Examples 4 to 6, wherein the circuitry is further to atomically set a field in the page table entry to indicate that a logical processor associated with the page fault has queued a decompress operation.

Example 8 includes a method, comprising storing a first address to a decompression work descriptor, retrieving a second address where a compressed page is stored in a compressed cache from the decompression work descriptor at the first address in response to an indication of a page fault, and sending instructions to a hardware decompression accelerator to decompress the compressed page at the second address.

Example 9 includes the method of Example 8, further comprising storing the first address of the decompression work descriptor in a scratchpad memory, wherein the decompression work descriptor includes the second address that corresponds to a next page to decompress.

Example 10 includes the method of Example 9, wherein the scratchpad memory comprises a model specific register that includes a field that indicates a logical processor associated with the model specific register.

Example 11 includes the method of any of Examples 9 to 10, further comprising loading a page table entry that corresponds to a virtual address of a page that faulted, determining if the page table entry indicates that the page is to be decompressed on fault, and, if so determined, generating an enqueue transaction to the hardware decompression accelerator with a compressed page address from the page table entry as a source and the second address retrieved from the decompression work descriptor as a target.

Example 12 includes the method of Example 11, further comprising skipping the generation of the enqueue transaction if the page table entry indicates that another decompress operation is queued.

Example 13 includes the method of any of Examples 11 to 12, further comprising skipping the generation of the enqueue transaction if the decompress work descriptor with the address of the compressed page is determined to be invalid.

Example 14 includes the method of any of Examples 11 to 13, further comprising atomically setting a field in the page table entry to indicate that a logical processor associated with the page fault has queued a decompress operation.

Example 15 includes an apparatus, comprising a hardware decompression accelerator, a compressed cache, a processor communicatively coupled to the hardware decompression accelerator and the compressed cache, and memory communicatively coupled to the processor, wherein the memory stores microcode instructions which when executed by the processor causes the processor to store a first address to a decompression work descriptor, retrieve a second address where a compressed page is stored in the compressed cache from the decompression work descriptor at the first address in response to an indication of a page fault, and send instructions to the hardware decompression accelerator to decompress the compressed page at the second address.

Example 16 includes the apparatus of Example 15, further comprising scratchpad memory communicatively coupled to the processor to store the first address of the decompression work descriptor, wherein the decompression work descriptor includes the second address that corresponds to a next page to decompress.

Example 17 includes the apparatus of Example 16, wherein the scratchpad memory comprises a model specific register that includes a field that indicates a logical processor associated with the model specific register.

Example 18 includes the apparatus of any of Examples 16 to 17, wherein the memory stores further instructions which when executed by the processor causes the processor to load a page table entry that corresponds to a virtual address of a page that faulted, determine if the page table entry indicates that the page is to be decompressed on fault, and, if so determined, generate an enqueue transaction to the hardware decompression accelerator with a compressed page address from the page table entry as a source and the second address retrieved from the decompression work descriptor as a target.

Example 19 includes the apparatus of Example 18, wherein the memory stores further instructions which when executed by the processor causes the processor to skip the generation of the enqueue transaction if the page table entry indicates that another decompress operation is queued.

Example 20 includes the apparatus of any of Examples 18 to 19, wherein the memory stores further instructions which when executed by the processor causes the processor to skip the generation of the enqueue transaction if the decompress work descriptor with the address of the compressed page is determined to be invalid.

Example 21 includes the apparatus of any of Examples 18 to 20, wherein the memory stores further instructions which when executed by the processor causes the processor to atomically set a field in the page table entry to indicate that a logical processor associated with the page fault has queued a decompress operation.

Example 22 includes an integrated circuit, comprising a core, a hardware decompression accelerator coupled to the core, a compressed cache coupled to the core, a processor coupled to the core and communicatively coupled to the hardware decompression accelerator and the compressed cache, and memory coupled to the core and communicatively coupled to the processor, wherein the memory stores microcode instructions which when executed by the processor causes the processor to store a first address to a decompression work descriptor, retrieve a second address where a compressed page is stored in the compressed cache from the decompression work descriptor at the first address in response to an indication of a page fault, and send instructions to the hardware decompression accelerator to decompress the compressed page at the second address.

Example 23 includes the integrated circuit of Example 22, further comprising scratchpad memory coupled to the core and communicatively coupled to the processor to store the first address of the decompression work descriptor, wherein the decompression work descriptor includes the second address that corresponds to a next page to decompress.

Example 24 includes the integrated circuit of Example 23, wherein the scratchpad memory comprises a model specific register that includes a field that indicates a logical processor associated with the model specific register.

Example 25 includes the integrated circuit of any of Examples 23 to 24, wherein the memory stores further instructions which when executed by the processor causes the processor to load a page table entry that corresponds to a virtual address of a page that faulted, determine if the page table entry indicates that the page is to be decompressed on fault, and, if so determined, generate an enqueue transaction to the hardware decompression accelerator with a compressed page address from the page table entry as a source and the second address retrieved from the decompression work descriptor as a target.

Example 26 includes the integrated circuit of Example 25, wherein the memory stores further instructions which when executed by the processor causes the processor to skip the generation of the enqueue transaction if the page table entry indicates that another decompress operation is queued.

Example 27 includes the integrated circuit of any of Examples 25 to 26, wherein the memory stores further instructions which when executed by the processor causes the processor to skip the generation of the enqueue transaction if the decompress work descriptor with the address of the compressed page is determined to be invalid.

Example 28 includes the integrated circuit of any of Examples 25 to 27, wherein the memory stores further instructions which when executed by the processor causes the processor to atomically set a field in the page table entry to indicate that a logical processor associated with the page fault has queued a decompress operation.

Example 29 includes a decompression apparatus, comprising means for storing a first address to a decompression work descriptor, means for retrieving a second address where a compressed page is stored in a compressed cache from the decompression work descriptor at the first address in response to an indication of a page fault, and means for sending instructions to a hardware decompression accelerator to decompress the compressed page at the second address.

Example 30 includes the apparatus of Example 29, further comprising means for storing the first address of the decompression work descriptor in a scratchpad memory, wherein the decompression work descriptor includes the second address that corresponds to a next page to decompress.

Example 31 includes the apparatus of Example 30, wherein the scratchpad memory comprises a model specific register that includes a field that indicates a logical processor associated with the model specific register.

Example 32 includes the apparatus of any of Examples 30 to 31, further comprising means for loading a page table entry that corresponds to a virtual address of a page that faulted, means for determining if the page table entry indicates that the page is to be decompressed on fault, and, if so determined, means for generating an enqueue transaction to the hardware decompression accelerator with a compressed page address from the page table entry as a source and the second address retrieved from the decompression work descriptor as a target.

Example 33 includes the apparatus of Example 32, further comprising means for skipping the generation of the enqueue transaction if the page table entry indicates that another decompress operation is queued.

Example 34 includes the apparatus of any of Examples 32 to 33, further comprising means for skipping the generation of the enqueue transaction if the decompress work descriptor with the address of the compressed page is determined to be invalid.

Example 35 includes the apparatus of any of Examples 32 to 34, further comprising means for atomically setting a field in the page table entry to indicate that a logical processor associated with the page fault has queued a decompress operation.

Example 36 includes at least one non-transitory machine readable medium comprising a plurality of instructions that, in response to being executed on a computing device, cause the computing device to store a first address to a decompression work descriptor, retrieve a second address where a compressed page is stored in a compressed cache from the decompression work descriptor at the first address in response to an indication of a page fault, and send instructions to a hardware decompression accelerator to decompress the compressed page at the second address.

Example 37 includes the at least one non-transitory machine readable medium of Example 36, comprising a plurality of further instructions that, in response to being executed on the computing device, cause the computing device to store the first address of the decompression work descriptor in a scratchpad memory, wherein the decompression work descriptor includes the second address that corresponds to a next page to decompress.

Example 38 includes the at least one non-transitory machine readable medium of Example 37, wherein the scratchpad memory comprises a model specific register that includes a field that indicates a logical processor associated with the model specific register.

Example 39 includes the at least one non-transitory machine readable medium of any of Examples 37 to 38, comprising a plurality of further instructions that, in response to being executed on the computing device, cause the computing device to load a page table entry that corresponds to a virtual address of a page that faulted, determine if the page table entry indicates that the page is to be decompressed on fault, and, if so determined, generate an enqueue transaction to the hardware decompression accelerator with a compressed page address from the page table entry as a source and the second address retrieved from the decompression work descriptor as a target.

Example 40 includes the at least one non-transitory machine readable medium of Example 39, comprising a plurality of further instructions that, in response to being executed on the computing device, cause the computing device to skip the generation of the enqueue transaction if the page table entry indicates that another decompress operation is queued.

Example 41 includes the at least one non-transitory machine readable medium of any of Examples 39 to 40, comprising a plurality of further instructions that, in response to being executed on the computing device, cause the computing device to skip the generation of the enqueue transaction if the decompress work descriptor with the address of the compressed page is determined to be invalid.

Example 42 includes the at least one non-transitory machine readable medium of any of Examples 39 to 41, comprising a plurality of further instructions that, in response to being executed on the computing device, cause the computing device to atomically set a field in the page table entry to indicate that a logical processor associated with the page fault has queued a decompress operation.

Example 43 includes an integrated circuit, comprising a core, a hardware decompression accelerator coupled to the core, a compressed cache coupled to the core, and circuitry coupled to the core and communicatively coupled to the hardware decompression accelerator and the compressed cache, the circuitry to load a page table entry in response to an indication of a page fault, determine if the page table entry indicates that the page is to be decompressed on fault, and, if so determined, modify a first decompression work descriptor at a first address and a second decompression work descriptor at a second address based on information from the page table entry, and generate a first enqueue transaction to the hardware decompression accelerator with the first address of the first decompression work descriptor and a second enqueue transaction to the hardware decompression accelerator with the second address of the second decompression work descriptor.

Example 44 includes the integrated circuit of Example 43, wherein the circuitry is further to determine the first address from the page table entry, and set the second address to a contiguous address after the first decompression work descriptor.

Example 45 includes the integrated circuit of Example 44, wherein the circuitry is further to set a first destination address field in the first decompression work descriptor to a designated page address associated with a logical core, and set a second destination address field in the second decompression work descriptor to the designated page address plus a predetermined length of a chunk of a page size.

Example 46 includes the integrated circuit of any of Examples 43 to 45, further comprising a scratchpad memory coupled to the core and communicatively coupled to the circuitry, wherein the circuitry is further to store the first decompression work descriptor and the second decompression work descriptor in the scratchpad memory, set the first address to an address of the first decompression work descriptor in the scratchpad memory, and set the second address to a contiguous address of the scratchpad memory after the first decompression work descriptor.

Example 47 includes the integrated circuit of Example 46, wherein the circuitry is further to read a first source address and a data length from a memory location indicated in the page table entry, set a second source address to the first source address plus the data length, set a first source address field in the first decompression work descriptor to the first source address, and set a second source address field in the second decompression work descriptor to the second source address.

Example 48 includes the integrated circuit of Example 47, wherein the compressed cache is arranged in pages, with each page having two or more chunks.

Example 49 includes the integrated circuit of Example 48, wherein the first decompression work descriptor corresponds to a first chunk of two or more chunks of a page of the compressed cache, and wherein the second decompression work descriptor corresponds to a second chunk of the two or more chunks of the page of the compressed cache.

Example 50 includes the integrated circuit of Example 49, wherein the circuitry is further to set a first destination address field in the first decompression work descriptor to a destination page address, and set a second destination address field in the second decompression work descriptor to the destination page address plus a size of the first chunk.

Example 51 includes a method, comprising loading a page table entry in response to an indication of a page fault, determining if the page table entry indicates that the page is to be decompressed on fault, and, if so determined, modifying a first decompression work descriptor at a first address and a second decompression work descriptor at a second address based on information from the page table entry, and generating a first enqueue transaction to a hardware decompression accelerator with the first address of the first decompression work descriptor and a second enqueue transaction to the hardware decompression accelerator with the second address of the second decompression work descriptor.

Example 52 includes the method of Example 51, further comprising determining the first address from the page table entry, and setting the second address to a contiguous address after the first decompression work descriptor.

Example 53 includes the method of Example 52, further comprising setting a first destination address field in the first decompression work descriptor to a designated page address associated with a logical core, and setting a second destination address field in the second decompression work descriptor to the designated page address plus a predetermined length of a chunk of a page size.

Example 54 includes the method of any of Examples 51 to 53, further comprising storing the first decompression work descriptor and the second decompression work descriptor in a scratchpad memory, setting the first address to an address of the first decompression work descriptor in the scratchpad memory, and setting the second address to a contiguous address of the scratchpad memory after the first decompression work descriptor.

Example 55 includes the method of Example 54, further comprising reading a first source address and a data length from a memory location indicated in the page table entry, setting a second source address to the first source address plus the data length, setting a first source address field in the first decompression work descriptor to the first source address, and setting a second source address field in the second decompression work descriptor to the second source address.

Example 56 includes the method of Example 55, wherein the compressed cache is arranged in pages, with each page having two or more chunks.

Example 57 includes the method of Example 56, wherein the first decompression work descriptor corresponds to a first chunk of two or more chunks of a page of the compressed cache, and wherein the second decompression work descriptor corresponds to a second chunk of the two or more chunks of the page of the compressed cache.

Example 58 includes the method of Example 57, further comprising setting a first destination address field in the first decompression work descriptor to a destination page address, and setting a second destination address field in the second decompression work descriptor to the destination page address plus a size of the first chunk.

Example 59 includes an apparatus, comprising a hardware decompression accelerator, a compressed cache, a processor communicatively coupled to the hardware decompression accelerator and the compressed cache, and memory communicatively coupled to the processor, wherein the memory stores microcode instructions that when executed by the processor causes the processor to load a page table entry in response to an indication of a page fault, determine if the page table entry indicates that the page is to be decompressed on fault, and, if so determined, modify a first decompression work descriptor at a first address and a second decompression work descriptor at a second address based on information from the page table entry, and generate a first enqueue transaction to the hardware decompression accelerator with the first address of the first decompression work descriptor and a second enqueue transaction to the hardware decompression accelerator with the second address of the second decompression work descriptor.

Example 60 includes the apparatus of Example 59, wherein the memory stores further microcode instructions which when executed by the processor causes the processor to determine the first address from the page table entry, and set the second address to a contiguous address after the first decompression work descriptor.

Example 61 includes the apparatus of Example 60, wherein the memory stores further microcode instructions which when executed by the processor causes the processor to set a first destination address field in the first decompression work descriptor to a designated page address associated with a logical core, and set a second destination address field in the second decompression work descriptor to the designated page address plus a predetermined length of a chunk of a page size.

Example 62 includes the apparatus of any of Examples 59 to 61, further comprising a scratchpad memory communicatively coupled to the processor to store the first decompression work descriptor and the second decompression work descriptor, and wherein the memory stores further microcode instructions which when executed by the processor causes the processor to set the first address to an address of the first decompression work descriptor in the scratchpad memory, and set the second address to a contiguous address of the scratchpad memory after the first decompression work descriptor.

Example 63 includes the apparatus of Example 62, wherein the memory stores further microcode instructions which when executed by the processor causes the processor to read a first source address and a data length from a memory location indicated in the page table entry, set a second source address to the first source address plus the data length, set a first source address field in the first decompression work descriptor to the first source address, and set a second source address field in the second decompression work descriptor to the second source address.

Example 64 includes the apparatus of Example 63, wherein the compressed cache is arranged in pages, with each page having two or more chunks.

Example 65 includes the apparatus of Example 64, wherein the first decompression work descriptor corresponds to a first chunk of two or more chunks of a page of the compressed cache, and wherein the second decompression work descriptor corresponds to a second chunk of the two or more chunks of the page of the compressed cache.

Example 66 includes the apparatus of Example 65, wherein the memory stores further microcode instructions which when executed by the processor causes the processor to set a first destination address field in the first decompression work descriptor to a destination page address, and set a second destination address field in the second decompression work descriptor to the destination page address plus a size of the first chunk.

Example 67 includes an integrated circuit, comprising a core, a hardware decompression accelerator coupled to the core, a compressed cache coupled to the core, a processor coupled to the core and communicatively coupled to the hardware decompression accelerator and the compressed cache, and memory coupled to the core and communicatively coupled to the processor, wherein the memory stores microcode instructions that when executed by the processor causes the processor to load a page table entry in response to an indication of a page fault, determine if the page table entry indicates that the page is to be decompressed on fault, and, if so determined, modify a first decompression work descriptor at a first address and a second decompression work descriptor at a second address based on information from the page table entry, and generate a first enqueue transaction to the hardware decompression accelerator with the first address of the first decompression work descriptor and a second enqueue transaction to the hardware decompression accelerator with the second address of the second decompression work descriptor.

Example 68 includes the integrated circuit of Example 67, wherein the memory stores further microcode instructions which when executed by the processor causes the processor to determine the first address from the page table entry, and set the second address to a contiguous address after the first decompression work descriptor.

Example 69 includes the integrated circuit of Example 68, wherein the memory stores further microcode instructions which when executed by the processor causes the processor to set a first destination address field in the first decompression work descriptor to a designated page address associated with a logical core, and set a second destination address field in the second decompression work descriptor to the designated page address plus a predetermined length of a chunk of a page size.

Example 70 includes the integrated circuit of any of Examples 67 to 69, further comprising a scratchpad memory communicatively coupled to the processor to store the first decompression work descriptor and the second decompression work descriptor, and wherein the memory stores further microcode instructions which when executed by the processor causes the processor to set the first address to an address of the first decompression work descriptor in the scratchpad memory, and set the second address to a contiguous address of the scratchpad memory after the first decompression work descriptor.

Example 71 includes the integrated circuit of Example 70, wherein the memory stores further microcode instructions which when executed by the processor causes the processor to read a first source address and a data length from a memory location indicated in the page table entry, set a second source address to the first source address plus the data length, set a first source address field in the first decompression work descriptor to the first source address, and set a second source address field in the second decompression work descriptor to the second source address.

Example 72 includes the integrated circuit of Example 71, wherein the compressed cache is arranged in pages, with each page having two or more chunks.

Example 73 includes the integrated circuit of Example 72, wherein the first decompression work descriptor corresponds to a first chunk of two or more chunks of a page of the compressed cache, and wherein the second decompression work descriptor corresponds to a second chunk of the two or more chunks of the page of the compressed cache.

Example 74 includes the integrated circuit of Example 73, wherein the memory stores further microcode instructions which when executed by the processor causes the processor to set a first destination address field in the first decompression work descriptor to a destination page address, and set a second destination address field in the second decompression work descriptor to the destination page address plus a size of the first chunk.

Example 75 includes a decompression apparatus, comprising means for loading a page table entry in response to an indication of a page fault, means for determining if the page table entry indicates that the page is to be decompressed on fault, and, if so determined, means for modifying a first decompression work descriptor at a first address and a second decompression work descriptor at a second address based on information from the page table entry, and means for generating a first enqueue transaction to a hardware decompression accelerator with the first address of the first decompression work descriptor and a second enqueue transaction to the hardware decompression accelerator with the second address of the second decompression work descriptor.

Example 76 includes the apparatus of Example 75, further comprising means for determining the first address from the page table entry, and means for setting the second address to a contiguous address after the first decompression work descriptor.

Example 77 includes the apparatus of Example 76, further comprising means for setting a first destination address field in the first decompression work descriptor to a designated page address associated with a logical core, and means for setting a second destination address field in the second decompression work descriptor to the designated page address plus a predetermined length of a chunk of a page size.

Example 78 includes the apparatus of any of Examples 75 to 77, further comprising means for storing the first decompression work descriptor and the second decompression work descriptor in a scratchpad memory, means for setting the first address to an address of the first decompression work descriptor in the scratchpad memory, and means for setting the second address to a contiguous address of the scratchpad memory after the first decompression work descriptor.

Example 79 includes the apparatus of Example 78, further comprising means for reading a first source address and a data length from a memory location indicated in the page table entry, means for setting a second source address to the first source address plus the data length, means for setting a first source address field in the first decompression work descriptor to the first source address, and means for setting a second source address field in the second decompression work descriptor to the second source address.

Example 80 includes the apparatus of Example 79, wherein the compressed cache is arranged in pages, with each page having two or more chunks.

Example 81 includes the apparatus of Example 80, wherein the first decompression work descriptor corresponds to a first chunk of two or more chunks of a page of the compressed cache, and wherein the second decompression work descriptor corresponds to a second chunk of the two or more chunks of the page of the compressed cache.

Example 82 includes the apparatus of Example 81, further comprising means for setting a first destination address field in the first decompression work descriptor to a destination page address, and means for setting a second destination address field in the second decompression work descriptor to the destination page address plus a size of the first chunk.

Example 83 includes at least one non-transitory machine readable medium comprising a plurality of instructions that, in response to being executed on a computing device, cause the computing device to load a page table entry in response to an indication of a page fault, determine if the page table entry indicates that the page is to be decompressed on fault, and, if so determined, modify a first decompression work descriptor at a first address and a second decompression work descriptor at a second address based on information from the page table entry, and generate a first enqueue transaction to a hardware decompression accelerator with the first address of the first decompression work descriptor and a second enqueue transaction to the hardware decompression accelerator with the second address of the second decompression work descriptor.

Example 84 includes the at least one non-transitory machine readable medium of Example 83, comprising a plurality of further instructions that, in response to being executed on the computing device, cause the computing device to determine the first address from the page table entry, and set the second address to a contiguous address after the first decompression work descriptor.

Example 85 includes the at least one non-transitory machine readable medium of Example 84, comprising a plurality of further instructions that, in response to being executed on the computing device, cause the computing device to set a first destination address field in the first decompression work descriptor to a designated page address associated with a logical core, and set a second destination address field in the second decompression work descriptor to the designated page address plus a predetermined length of a chunk of a page size.

Example 86 includes the at least one non-transitory machine readable medium of any of Examples 83 to 85, comprising a plurality of further instructions that, in response to being executed on the computing device, cause the computing device to store the first decompression work descriptor and the second decompression work descriptor in a scratchpad memory, set the first address to an address of the first decompression work descriptor in the scratchpad memory, and set the second address to a contiguous address of the scratchpad memory after the first decompression work descriptor.

Example 87 includes the at least one non-transitory machine readable medium of Example 86, comprising a plurality of further instructions that, in response to being executed on the computing device, cause the computing device to read a first source address and a data length from a memory location indicated in the page table entry, set a second source address to the first source address plus the data length, set a first source address field in the first decompression work descriptor to the first source address, and set a second source address field in the second decompression work descriptor to the second source address.

Example 88 includes the at least one non-transitory machine readable medium of Example 87, wherein the compressed cache is arranged in pages, with each page having two or more chunks.

Example 89 includes the at least one non-transitory machine readable medium of Example 88, wherein the first decompression work descriptor corresponds to a first chunk of two or more chunks of a page of the compressed cache, and wherein the second decompression work descriptor corresponds to a second chunk of the two or more chunks of the page of the compressed cache.

Example 90 includes the at least one non-transitory machine readable medium of Example 89, comprising a plurality of further instructions that, in response to being executed on the computing device, cause the computing device to set a first destination address field in the first decompression work descriptor to a destination page address, and set a second destination address field in the second decompression work descriptor to the destination page address plus a size of the first chunk.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

Some portions of the detailed description herein are presented in terms of algorithms and symbolic representations of operations on data bits within a computer memory. These algorithmic descriptions and representations are the means used by those skilled in the computing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the discussion herein, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Certain embodiments also relate to apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs) such as dynamic RAM (DRAM), EPROMs, EEPROMs, magnetic or optical cards, or any type of media suitable for storing electronic instructions, and coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear from the description herein. In addition, certain embodiments are not described with reference to any particular programming language. It will be appreciated that a variety of programming languages may be used to implement the teachings of such embodiments as described herein.

Besides what is described herein, various modifications may be made to the disclosed embodiments and implementations thereof without departing from their scope. Therefore, the illustrations and examples herein should be construed in an illustrative, and not a restrictive sense. The scope of the invention should be measured solely by reference to the claims that follow.

What is claimed is:

1. An integrated circuit, comprising:
a core;
a hardware decompression accelerator (HDA) coupled to the core;
a compressed cache coupled to the core;
a scratchpad memory; and
circuitry coupled to the core and communicatively coupled to each of the HDA, the scratchpad memory and the compressed cache, the circuitry to execute microcode to provide a first page fault handler, comprising the circuitry to:
store to the scratchpad memory a first address to a decompression work descriptor which is to comprise a second address of a compressed page which is stored in the compressed cache;
detect a page fault; and
in response to the page fault:
send a page fault exception to a second page fault handler of an operating system which is executed with the core;
access the scratchpad memory to perform an identification of the first address; and
based on the identification:
retrieve the second address from the decompression work descriptor; and
send to the HDA an enqueue message which comprises the second address, wherein, based on the enqueue message, the HDA is to enqueue one or more instructions to decompress the compressed page at the second address.

2. The integrated circuit of claim 1, wherein the scratchpad memory comprises a model specific register that includes a field that indicates a logical processor associated with the model specific register.

3. The integrated circuit of claim 1, wherein the circuitry is further to:
load a page table entry that corresponds to a virtual address of a page that faulted;
determine if the page table entry indicates that the page is to be decompressed on fault, and, if so determined,
generate an enqueue transaction to the HDA with a compressed page address from the page table entry as a source and the second address retrieved from the decompression work descriptor as a target.

4. The integrated circuit of claim 3, wherein the circuitry is further to:
skip the generation of the enqueue transaction if the page table entry indicates that another decompress operation is queued.

5. The integrated circuit of claim 3, wherein the circuitry is further to:
skip the generation of the enqueue transaction if the decompression work descriptor with the second address of the compressed page is determined to be invalid.

6. The integrated circuit of claim 3, wherein the circuitry is further to:
atomically set a field in the page table entry to indicate that a logical processor associated with the page fault has queued a decompress operation.

7. A method, comprising:
with a first page fault handler provided by an execution of microcode:
storing to a scratchpad memory a first address to a decompression work descriptor which comprises a second address of a compressed page stored in a compressed cache;
detecting a page fault; and
in response to the page fault:
sending a page fault exception to a second page fault handler of an operating system which is executed with a core;
accessing the scratchpad memory to perform an identification of the first address; and
based on the identification:
retrieving the second address from the decompression work descriptor; and
sending to a hardware decompression accelerator (HDA) an enqueue message which comprises the second address, wherein, based on the enqueue message, the HDA enqueues one or more instructions to decompress the compressed page at the second address.

8. The method of claim 7, wherein the scratchpad memory comprises a model specific register that includes a field that indicates a logical processor associated with the model specific register.

9. The method of claim 7, further comprising:
loading a page table entry that corresponds to a virtual address of a page that faulted;
determining if the page table entry indicates that the page is to be decompressed on fault, and, if so determined,
generating an enqueue transaction to the HDA with a compressed page address from the page table entry as a source and the second address retrieved from the decompression work descriptor as a target.

10. The method of claim 9, further comprising:
skipping the generation of the enqueue transaction if the page table entry indicates that another decompress operation is queued.

11. The method of claim 9, further comprising:
skipping the generation of the enqueue transaction if the decompression work descriptor with the second address of the compressed page is determined to be invalid.

12. The method of claim 9, further comprising:
atomically setting a field in the page table entry to indicate that a logical processor associated with the page fault has queued a decompress operation.

13. An apparatus, comprising:
a hardware decompression accelerator (HDA);
a compressed cache;
a processor communicatively coupled to the HDA and the compressed cache; and
memory communicatively coupled to the processor, wherein the memory stores microcode instructions which when executed by circuitry of the processor causes the circuitry to provide a first page fault handler, comprising the circuitry to:
store to a scratchpad memory a first address to a decompression work descriptor which is to comprise a second address of a compressed page which is stored in the compressed cache;

detect a page fault; and in response to the page fault:
send a page fault exception to a second page fault handler of an operating system which is executed with a core of the processor;
access the scratchpad memory to perform an identification of the first address; and
based on the identification:
retrieve the second address from the decompression work descriptor; and
send to the HDA an enqueue message which comprises the second address, wherein, based on the enqueue message, the HDA is to enqueue one or more instructions to decompress the compressed page at the second address.

14. The apparatus of claim 13, wherein the scratchpad memory comprises a model specific register that includes a field that indicates a logical processor associated with the model specific register.

15. The apparatus of claim 13, wherein the memory stores further instructions which when executed by the processor causes the processor to:
load a page table entry that corresponds to a virtual address of a page that faulted;
determine if the page table entry indicates that the page is to be decompressed on fault, and, if so determined,
generate an enqueue transaction to the HDA with a compressed page address from the page table entry as a source and the second address retrieved from the decompression work descriptor as a target.

16. The apparatus of claim 15, wherein the memory stores further instructions which when executed by the processor causes the processor to:
skip the generation of the enqueue transaction if the page table entry indicates that another decompress operation is queued.

17. The apparatus of claim 15, wherein the memory stores further instructions which when executed by the processor causes the processor to:
skip the generation of the enqueue transaction if the decompression work descriptor with the second address of the compressed page is determined to be invalid.

18. The apparatus of claim 15, wherein the memory stores further instructions which when executed by the processor causes the processor to:
atomically set a field in the page table entry to indicate that a logical processor associated with the page fault has queued a decompress operation.

* * * * *